United States Patent
Daigo et al.

(10) Patent No.: US 11,035,034 B2
(45) Date of Patent: Jun. 15, 2021

(54) FILM FORMATION METHOD, VACUUM PROCESSING APPARATUS, METHOD OF MANUFACTURING SEMICONDUCTOR LIGHT EMITTING ELEMENT, SEMICONDUCTOR LIGHT EMITTING ELEMENT, METHOD OF MANUFACTURING SEMICONDUCTOR ELECTRONIC ELEMENT, SEMICONDUCTOR ELECTRONIC ELEMENT, AND ILLUMINATING APPARATUS

(71) Applicant: CANON ANELVA CORPORATION, Kawasaki (JP)

(72) Inventors: Yoshiaki Daigo, Kawasaki (JP); Takuya Seino, Kawasaki (JP); Yoshitaka Ohtsuka, Kawasaki (JP); Hiroyuki Makita, Kawasaki (JP); Sotaro Ishibashi, Kawasaki (JP); Kazuto Yamanaka, Kawasaki (JP)

(73) Assignee: CANON ANELVA CORPORATION, Kanagawa (JP)

(*) Notice: Subject to any disclaimer, the term of this patent is extended or adjusted under 35 U.S.C. 154(b) by 118 days.

(21) Appl. No.: 15/416,720

(22) Filed: Jan. 26, 2017

(65) Prior Publication Data
US 2017/0145588 A1    May 25, 2017

Related U.S. Application Data

(63) Continuation of application No. PCT/JP2015/003466, filed on Jul. 9, 2015.

(30) Foreign Application Priority Data

Jul. 28, 2014 (JP) .............................. JP2014-152628

(51) Int. Cl.
*C23C 14/06* (2006.01)
*C23C 14/08* (2006.01)
(Continued)

(52) U.S. Cl.
CPC ...... *C23C 14/0617* (2013.01); *C23C 14/3435* (2013.01); *C23C 14/50* (2013.01);
(Continued)

(58) Field of Classification Search
CPC ... C23C 14/3492; C23C 14/50; C23C 14/617; C23C 14/541; C23C 14/0617;
(Continued)

(56) References Cited

U.S. PATENT DOCUMENTS 4,173,661 A * 11/1979 Bourdon ................. C23C 16/24
                                                                  438/485
7,763,153 B2    7/2010 Takahashi et al.
(Continued)

FOREIGN PATENT DOCUMENTS

JP    2000-345339 A    12/2000
JP    2007-88314 A     4/2007
(Continued)

OTHER PUBLICATIONS

'Peak-to-peak amplitude' definition, www.wikipedia.org[https://en.wikipedia.org/wiki/Amplitude] [Accessed on Mar. 19, 2021].*
(Continued)

*Primary Examiner* — Michael A Band
(74) *Attorney, Agent, or Firm* — Venable LLP

(57) ABSTRACT

The present invention provides a film formation method and a film formation apparatus which can fabricate an epitaxial film with +c polarity by a sputtering method. In one embodiment of the present invention, the film formation method of epitaxially growing a semiconductor thin film with a wurtzite structure by the sputtering method on an epitaxial growth (Continued)

substrate heated to a predetermined temperature by a heater includes the following steps. First, the substrate is disposed on a substrate holding portion including the heater to be located at a predetermined distance away from the heater. Then, the epitaxial film of the semiconductor film with the wurtzite structure is formed on the substrate with the impedance of the substrate holding portion being adjusted.

6 Claims, 9 Drawing Sheets

(51) Int. Cl.
| | |
|---|---|
| C23C 14/34 | (2006.01) |
| C23C 14/50 | (2006.01) |
| C23C 14/54 | (2006.01) |
| C30B 23/00 | (2006.01) |
| C30B 23/06 | (2006.01) |
| C30B 29/40 | (2006.01) |
| H01L 21/02 | (2006.01) |
| H01L 33/00 | (2010.01) |
| H01L 33/16 | (2010.01) |
| H01L 33/32 | (2010.01) |
| C30B 23/08 | (2006.01) |
| C30B 29/16 | (2006.01) |
| H01L 33/28 | (2010.01) |

(52) U.S. Cl.
CPC ............ *C23C 14/54* (2013.01); *C23C 14/541* (2013.01); *C30B 23/002* (2013.01); *C30B 23/063* (2013.01); *C30B 29/403* (2013.01); *H01L 21/0254* (2013.01); *H01L 21/02433* (2013.01); *H01L 33/007* (2013.01); *H01L 33/16* (2013.01); *C23C 14/086* (2013.01); *C30B 23/066* (2013.01); *C30B 23/08* (2013.01); *C30B 29/16* (2013.01); *H01L 21/0242* (2013.01); *H01L 21/02378* (2013.01); *H01L 21/02381* (2013.01); *H01L 21/02554* (2013.01); *H01L 21/02587* (2013.01); *H01L 21/02631* (2013.01); *H01L 33/0087* (2013.01); *H01L 33/28* (2013.01); *H01L 33/32* (2013.01)

(58) Field of Classification Search
CPC ....... C30B 25/06; C30B 23/063; C30B 29/38; C30B 29/40; C30B 29/403; C30B 29/406; H01L 21/02433; H01L 21/02381; H01L 21/02587; H01L 21/02378; H01L 21/02631; H01L 21/0254; H01L 33/16; H01L 33/0087; H01L 33/007; H01L 33/32; H01J 37/32183; H01J 37/3464
See application file for complete search history.

(56) References Cited

U.S. PATENT DOCUMENTS

| | | | |
|---|---|---|---|
| 9,252,322 B2 | 2/2016 | Daigo et al. | |
| 9,309,606 B2 | 4/2016 | Daigo | |
| 9,379,279 B2 | 6/2016 | Daigo | |
| 2007/0123004 A1 | 5/2007 | Takahashi et al. | |
| 2010/0193128 A1 | 8/2010 | Koumura et al. | |
| 2010/0213476 A1 | 8/2010 | Yokoyama et al. | |
| 2010/0252417 A1* | 10/2010 | Allen ................... | C23C 14/345 204/192.12 |
| 2013/0049064 A1 | 2/2013 | Daigo et al. | |
| 2013/0277206 A1 | 10/2013 | Daigo et al. | |
| 2014/0225154 A1 | 8/2014 | Daigo | |
| 2015/0102371 A1 | 4/2015 | Daigo | |
| 2017/0309480 A1 | 10/2017 | Daigo et al. | |

FOREIGN PATENT DOCUMENTS

| | | |
|---|---|---|
| JP | 2008-109084 A | 5/2008 |
| TW | 201340379 A | 10/2013 |
| WO | 2009/005148 A1 | 8/2009 |
| WO | 2009/096270 A1 | 8/2009 |
| WO | 2011/136016 A1 | 11/2011 |
| WO | 2012/090422 A1 | 7/2012 |
| WO | 2014/002465 A | 1/2014 |

OTHER PUBLICATIONS

Notification of Reasons for Refusal dated May 31, 2017, in counterpart JP application No. 2016-537730 with English translation.
Y. Daigo et al., "Synthesis of epitaxial GaN single-crystalline film by ultra high vacuum r.f. magnetron sputtering method," Thin Solid Films, vol. 483, pp. 38-43 (2005).
Official letter dated May 17, 2016, in counterpart Taiwan application No. 104123770 with English translation.
International Search Report dated Sep. 30, 2015, in corresponding PCT/JP2015/003466 (1 page).

* cited by examiner

FILM FORMATION METHOD, VACUUM PROCESSING APPARATUS, METHOD OF MANUFACTURING SEMICONDUCTOR LIGHT EMITTING ELEMENT, SEMICONDUCTOR LIGHT EMITTING ELEMENT, METHOD OF MANUFACTURING SEMICONDUCTOR ELECTRONIC ELEMENT, SEMICONDUCTOR ELECTRONIC ELEMENT, AND ILLUMINATING APPARATUS

CROSS-REFERENCES TO RELATED APPLICATIONS

This application is a continuation application of International Application No. PCT/JP2015/003466, filed Jul. 9, 2015, which claims the benefit of Japanese Patent Application No. 2014-152628, filed Jul. 28, 2014 and International Application No. PCT/JP2015/001631 filed Mar. 23, 2015. The contents of the aforementioned applications are incorporated herein by reference in their entireties.

TECHNICAL FIELD

The present invention relates to a film formation method, a vacuum processing apparatus, a method of manufacturing a semiconductor light emitting element, a semiconductor light emitting element, a method of manufacturing a semiconductor electronic element, a semiconductor electronic element, and an illuminating apparatus.

BACKGROUND ART

Group III nitride semiconductors are compound semiconductor materials obtained as compounds of aluminum (Al) atoms, gallium (Ga) atoms, or indium (In) atoms which are group-IIIB elements (hereafter, simply referred to as group III elements) with nitrogen (N) atoms which are a group-VB element (hereafter, simply referred to as group V element), specifically, aluminum nitride (AlN), gallium nitride (GaN), indium nitride (InN), and mixed crystals thereof (AlGaN, InGaN, InAlN, and InGaAlN). Such group III nitride semiconductors are materials expected to be applied to optical elements such as a light emitting diode (LED), a laser diode (LD), a photovoltaic solar cell (PVSC), and a photo diode (PD) which cover a large wavelength region from far-ultraviolet to visible light and to near-infrared, and to electronic elements such as a high electron mobility transistor (HEMT) and a metal-oxide-semiconductor field effect transistor (MOSFET) for high-frequency and high-output usage.

Generally, in order to achieve applications like those described above, it is necessary to epitaxially grow a group III nitride semiconductor thin film on a single-crystal substrate and obtain a high-quality single crystal film (epitaxial film) with few crystal defects. In order to obtain such an epitaxial film, performing homo-epitaxial growth using a substrate made of the same material as the epitaxial film is most desirable.

However, a single-crystal substrate made of a group III nitride semiconductor is very expensive and is thus not used except for certain applications. Instead, the single-crystal film is mainly obtained by performing hetero-epitaxial growth on a substrate made of a different material such as sapphire ($\alpha$-Al$_2$O$_3$), silicon (Si), or silicon carbide (SiC).

In the epitaxial growth of the group III nitride semiconductor thin film described above, a metal-organic chemical vapor deposition (MOCVD) method is used in which a high-quality epitaxial film can be obtained with high productivity. However, the MOCVD method has problems such as high production cost. Moreover, particles tend to be generated in the MOCVD method and it is difficult to achieve high yield.

Meanwhile, a sputtering method has such characteristics that the production cost can be suppressed to a low level and the probability of generation of particles is low. Accordingly, replacing at least part of formation processes of the group III nitride semiconductor thin film with the sputtering method may at least partially solve the problems described above.

However, the group III nitride semiconductor thin film fabricated by the sputtering method has a problem that the crystalline quality thereof tends to be poorer than that fabricated by the MOCVD method. For example, Non Patent Document 1 discloses the crystallinity of a group III nitride semiconductor thin film fabricated by using the sputtering method. In the description of Non Patent Document 1, a c-axis oriented GaN film is epitaxially grown on an $\alpha$-Al$_2$O$_3$(0001) substrate by using a radio-frequency magnetron sputtering method, and the full width at half maximum (FWHM) in X-ray rocking curve (XRC) measurement on a GaN (0002) plane is 35.1 arcmin (2106 arcsec). This value is far greater than the values of the GaN films on the $\alpha$-Al$_2$O$_3$ substrates currently on the market and indicates that tilt mosaic spread to be described later is great and crystalline quality is poor.

In other words, in order to employ the sputtering method as the film formation process of the group III nitride semiconductor thin film, it is necessary to reduce the mosaic spread of the epitaxial film made of the group III nitride semiconductor and achieve high crystalline quality.

As indices of the crystalline quality of an epitaxial film made of a group III nitride semiconductor, there are a tilt mosaic spread (variation of crystalline orientation in a vertical direction of the substrate) and a twist mosaic spread (variation of crystalline orientation in an in-plane direction). FIGS. 8A to 8D are schematic views of crystals made of a group III nitride semiconductor epitaxially grown on an $\alpha$-Al$_2$O$_3$(0001) substrate to be oriented along the c-axis. In FIGS. 8A to 8D, reference numeral 901 denotes the $\alpha$-Al$_2$O$_3$ (0001) substrate, 902 to 911 denote the crystals made of the group III nitride semiconductor, $c_f$ denotes the c-axis orientation of each of the crystals made of the group III nitride semiconductor, $c_s$ denotes the c-axis orientation of the $\alpha$-Al$_2$O$_3$(0001) substrate, $a_f$ denotes the a-axis orientation of each of the crystals made of the group III nitride semiconductor, and $a_s$ denotes the a-axis orientation of the $\alpha$-Al$_2$O$_3$ (0001) substrate.

FIG. 8A depicts a perspective view of how the crystals made of the group III nitride semiconductor are formed with the tilt mosaic spread, and FIG. 8B illustrates a partial cross-sectional structure of the crystals. As apparent from FIGS. 8A and 8B, the c-axis orientations $c_f$ of the crystals 902, 903, and 904 made of the group III nitride semiconductor are substantially parallel to the c-axis orientation $c_s$ of the substrate, and are the dominant crystalline orientation in the vertical direction of the substrate in the crystals as a whole. Meanwhile the c-axis orientations $c_f$ of the crystals 905 and 906 made of the group III nitride semiconductor are formed to be slightly offset from the dominant crystalline orientation in the vertical direction of the substrate described above. Moreover, FIG. 8C depicts a perspective view of how the crystals made of the group III nitride semiconductor are formed with the twist mosaic spread, and FIG. 8D illustrates the top view of the crystals. As apparent from FIGS. 8C and 8D, the a-axis orientations $a_f$ of the crystals 907, 908, and 909 made of the group III nitride semiconductor each form an angle of substantially 30° with the a-axis orientation $a_s$ of the $\alpha$-Al$_2$O$_3$(0001) substrate, and are the dominant crystalline orientation in the in-plane direction in the crystals as a whole. Meanwhile, the a-axis orientations $a_f$ of the crystals 910 and 911 made of the group III nitride semiconductor are formed to be slightly offset from the dominant crystalline orientation in the in-plane direction described above.

Such variations from the dominant crystalline orientation in the crystals as a whole are referred to as mosaic spreads. Particularly, the variation of the crystalline orientation in the vertical direction of the substrate is referred to as tilt mosaic spread, and the variation of the crystalline orientation in the in-plane direction is referred to as twist mosaic spread. The tilt and twist mosaic spreads are known to be correlated to the density of defects such as screw dislocation and edge dislocation formed inside the group III nitride semiconductor thin film. Reducing the tilt and twist mosaic spreads reduces the aforementioned density of the defects, and a high-quality group III nitride semiconductor thin film is more likely to be obtained.

Note that the degrees of tilt and twist mosaic spreads can be evaluated by performing XRC measurement on a specific lattice plane (symmetric plane) formed parallel to the substrate surface and on a specific lattice plane formed perpendicular to the substrate surface and studying FWHM of diffraction peaks obtained in the XRC measurement.

Note that FIGS. 8A to 8D and the above description are used to describe the concept of the tilt and twist mosaic spreads in a comprehensible way, and preciseness thereof is not guaranteed.

Moreover, it is generally known that the group III nitride semiconductor thin film has growth behaviors of +c polarity and +c polarity as illustrated in FIG. 9, and a high-quality epitaxial film is more likely to be obtained in the +c polarity growth than in the +c polarity growth. Accordingly, it is desirable that an epitaxial film with +c polarity is obtained in a sputtering method to be employed as the film formation process of the group III nitride semiconductor thin film.

Note that, in this description, "+c polarity" is a term relating to AlN, GaN, and InN and meaning Al polarity, Ga polarity, and In polarity. Moreover, "+c polarity" is a term meaning N polarity.

Many attempts have been conventionally made to obtain a high-quality group III nitride semiconductor thin film (see Patent Documents 1 and 2).

Patent Document 1 discloses a method of achieving an increase in the quality of a group III nitride semiconductor thin film (AlN in Patent Document 1) by performing plasma treatment on an $\alpha$-Al$_2$O$_3$ substrate before forming the group III nitride semiconductor thin film on the substrate by using a sputtering method, particularly a method of obtaining a group III nitride semiconductor thin film with an extremely small tilt mosaic spread.

Moreover, Patent Document 2 discloses a method of manufacturing a group III nitride semiconductor (group-III nitride compound semiconductor in Patent Document 2) light emitting element in which a buffer layer (intermediate layer in Patent Document 2) made of a group III nitride semiconductor (group-III nitride compound in Patent Document 2) is formed on a substrate by a sputtering method and an n-type semiconductor layer including an underlying film, a light emitting layer, and a p-type semiconductor layer are sequentially stacked on the buffer layer made of the group III nitride semiconductor.

Patent Document 2 discloses that the method includes, as processes of forming the buffer layer made of the group III nitride semiconductor, a preprocessing step of performing plasma treatment on the substrate and a step of forming the buffer layer made of the group III nitride semiconductor by the sputtering method after the preprocessing step. Moreover, in Patent Document 2, the $\alpha$-Al$_2$O$_3$ substrate and AlN are used as preferable modes of the substrate and the buffer layer made of the group III nitride semiconductor, and the MOCVD method is preferably used as the film formation method of the n-type semiconductor layer including the underlying film, the light emitting layer, and the p-type semiconductor layer.

CITATION LIST

Patent Document

Patent Document 1: International Patent Application Publication No. WO2009/096270
Patent Document 2: Japanese Patent Application Laid-Open No. 2008-109084

Non Patent Document

Non Patent Document 1: Y. Daigo, N. Mutsukura, "Synthesis of epitaxial GaN single-crystalline film by ultra high vacuum r.f. magnetron sputtering method", Thin Solid Films 483 (2005) p 38-43.

SUMMARY OF INVENTION

As apparent from above, the technique described in Patent Document 1 is a technique capable of reducing the tilt mosaic spread, but still has a problem to be solved in order to form an epitaxial film with higher quality by using the sputtering method. Particularly, since performing the +c polarity growth as described above enables formation of the high-quality epitaxial film, formation of the group III nitride semiconductor thin film with +c polarity over the entire substrate surface is desired. However, Patent Document 1 describes no specific means for obtaining the desired polarity. The present inventors performed experiments to confirm the technique disclosed in Patent Document 1. As a result, although the obtained group III nitride semiconductor thin film was obtained as an epitaxial film with a small mosaic spread, +c polarity and +c polarity both existed in the group III nitride semiconductor thin film. Accordingly, it is clear that the group III nitride semiconductor thin film with +c polarity cannot be obtained only by the technique disclosed in Patent Document 1.

Moreover, the technique described in Patent Document 2 cannot be necessary said to be sufficient from the view point described below.

Specifically, Patent Document 2 does not describe a method of controlling the polarity of the buffer layer formed by using the sputtering method and made of the group III nitride semiconductor. In the experiment performed by the present inventors to confirm the technique disclosed in Patent Document 2, good light emission characteristics could not be obtained in the light emitting element obtained in the experiment.

The present inventors further studied the light emitting element obtained in the experiment to confirm Patent Document 2, and found that the buffer layer formed by using the sputtering method and made of the group III nitride semiconductor was an epitaxial film in which+c polarity and +c polarity both existed. To be more specific, although the n-type semiconductor layer including the underlying film, the light emitting layer, and the p-type semiconductor layer were sequentially stacked by the MOCVD method, many defects such as an anti-phase domain boundary caused by mixed polarities in the buffer layer made of the group III nitride semiconductor were formed inside the element and the light emitting characteristic was decreased. In other words, it is clear that the group III nitride semiconductor thin film with +c polarity and the light emitting element with a good light emitting characteristic cannot be obtained only by the technique disclosed in Patent Document 2.

As described above, it is difficult to control the polarity of the group III nitride semiconductor thin film, that is, obtain the epitaxial film with +c polarity and obtain a better light emitting element, only by using the conventional techniques disclosed in Patent Documents 1 and 2.

Furthermore, from the aforementioned results of the experiments to confirm the Patent Documents 1 and 2, the present inventors have come to a conclusion that, when the group III nitride semiconductor thin film fabricated by using the sputtering method is the epitaxial film with mixed polarities, it is impossible to avoid decreases in element characteristics due to defects such as anti-phase domain boundary formed inside the element.

In view of the problems described above, an object of the present invention is to provide a film formation method capable of fabricating an epitaxial film with +c polarity by the sputtering method and a vacuum processing apparatus suitable for this film formation method and to also provide methods of manufacturing a semiconductor light emitting element and a semiconductor electronic element using this epitaxial film, a semiconductor light emitting element and a semiconductor electronic element manufactured by these methods, and an illuminating apparatus.

The present inventors have earnestly studied, and as a result found that the polarity of an epitaxial film is affected by a method of placing a substrate on a substrate holder and furthermore that the polarity of the epitaxial film can be controlled by connecting an impedance varying mechanism to an electrically-conductive substrate holding device provided in an outer peripheral portion of the substrate and adjusting the impedance of the substrate holding device, and completed the present invention.

A film formation method of the present invention is a film formation method of forming an epitaxial film of a semiconductor thin film with a wurtzite structure on a substrate in a sputtering method by using a vacuum processing apparatus including: a vacuum chamber capable of being vacuumed; a substrate holding portion which supports the substrate in the vacuum chamber; a heater capable of heating the substrate held by the substrate holding portion to a given temperature; a target electrode which is provided in the vacuum chamber and to which a target is attachable; a radio-frequency power supply which inputs radio-frequency power into the target via the target electrode; an electrode portion which is disposed around the substrate held by the substrate holding portion and which forms part of a return route through which the radio-frequency power inputted from the radio-frequency power supply returns to a ground; and an impedance adjuster which adjusts impedance of the electrode portion, the film formation method comprising: a substrate transporting step of causing the substrate holding portion to hold the substrate at a predetermined distance away from a substrate facing surface of the heater; a film formation step of forming the semiconductor thin film with the wurtzite structure on the substrate held by the substrate holding portion; and an impedance adjustment step of adjusting the impedance adjuster such that the impedance of the electrode portion is set to a predetermined value in the film formation step.

Moreover, methods of manufacturing a semiconductor light emitting element and a semiconductor electronic element of the present invention comprise the film formation method described above. Furthermore, a semiconductor light emitting element and a semiconductor electronic element of the present invention comprise the epitaxial film of the semiconductor thin film with the wurtzite structure fabricated by the film formation method described above. An illuminating apparatus of the present invention comprises the semiconductor light emitting element described above.

Meanwhile, a vacuum processing apparatus of the present invention is a vacuum processing apparatus comprising: a vacuum chamber capable of being vacuumed; a substrate holding portion which supports a substrate in the vacuum chamber; a heater capable of heating the substrate held by the substrate holding portion to a given temperature; a target electrode which is provided in the vacuum chamber and to which a target is attachable; a radio-frequency power supply which inputs radio-frequency power into the target via the target electrode; an electrode portion which is disposed around the substrate held by the substrate holding portion and which forms part of a return route through which the radio-frequency power inputted from the radio-frequency power supply returns to a ground; and an impedance adjuster which adjusts impedance of the electrode portion, wherein the substrate holding portion is provided in the vacuum chamber away from the target electrode in a direction of gravity, and the vacuum processing apparatus performs: a substrate transporting step of causing the substrate holding portion to hold the substrate at a predetermined distance away from a substrate facing surface of the heater; a film formation step of forming a semiconductor thin film with a wurtzite structure on the substrate held by the substrate holding portion; and an impedance adjustment step of adjusting the impedance adjuster such that the impedance of the electrode portion is set to a predetermined value in the film formation step.

According to the film formation method and the vacuum processing apparatus of the present invention, the epitaxial film having+c polarity and the wurtzite structure can be fabricated on the substrate by using the sputtering method with small tilt and twist mosaic spreads. Moreover, according to the film formation method and the vacuum processing apparatus of the present invention, it is possible to reduce variation of the proportion of +c polarity described above among treated substrates and obtain the epitaxial film with excellent reproducibility. Furthermore, the semiconductor light emitting element and the semiconductor electronic element fabricated by using the film formation method of the present invention or the illuminating apparatus comprising the semiconductor light emitting element have stable quality.

DESCRIPTION OF EMBODIMENTS

Figure 1:
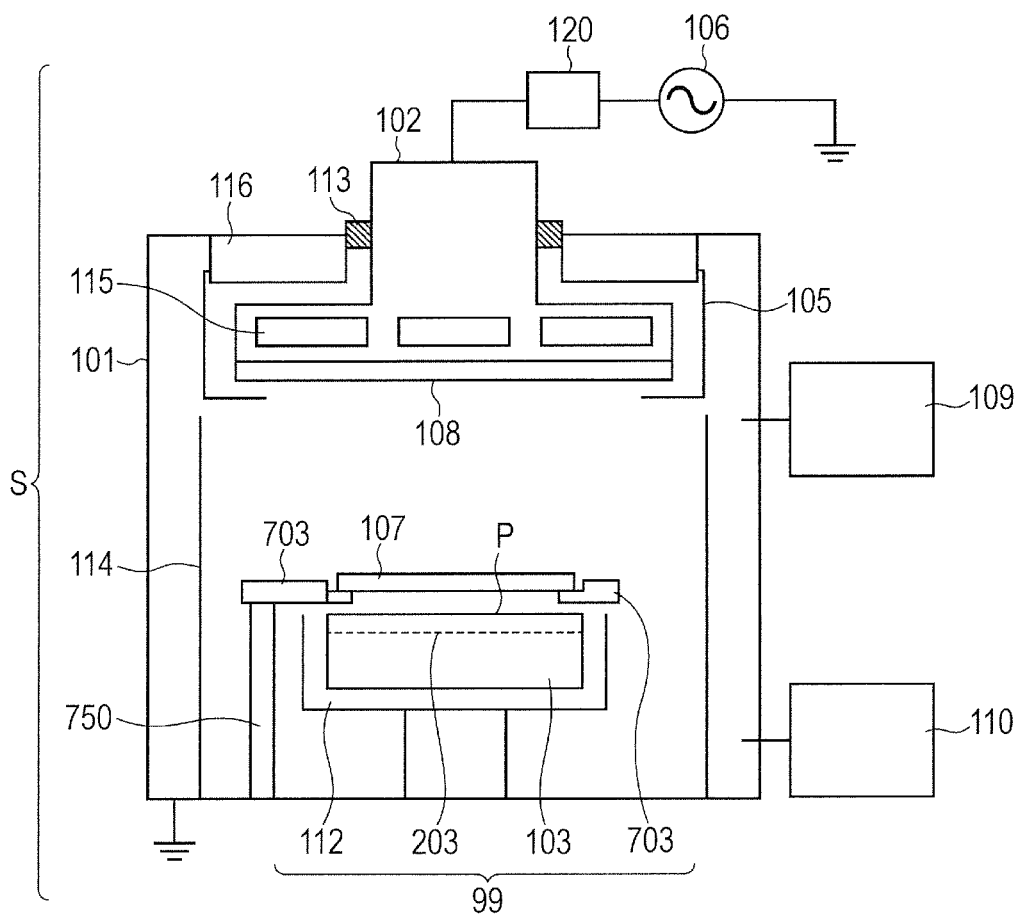
FIG. 1 is a schematic cross-sectional diagram of a radio-frequency sputtering apparatus in one embodiment of the present invention.

An Embodiment of the present invention is described below in detail with reference to the drawings. Note that, in the drawings described below, portions with the same functions are denoted by the same reference numerals and overlapping description thereof is omitted.

A main characteristic of the present invention is such that, when a semiconductor thin film having a wurtzite structure is epitaxially grown on a later-described epitaxial growth substrate by a sputtering method such as, for example, a radio-frequency sputtering method, the film formation of the semiconductor thin film having the wurtzite structure is performed while the substrate heated by a heater is held at a predetermined distance away from a substrate facing surface of the heater. Note that examples of the epitaxial growth substrate include substrates having non-polar surfaces (to be described later) such as an $\alpha$-$Al_2O_3$ substrate, a Si substrate, and a Ge substrate, substrates having polar surfaces (to be described later) such as a 4H-SiC substrate and a 6H-SiC substrate, and the like. Examples of the semiconductor thin film having the wurtzite structure include a group III nitride semiconductor thin film, a ZnO-based semiconductor thin film, and the like with the wurtzite structure.

Moreover, a further characteristic of the present invention is such that, when the semiconductor thin film having the wurtzite structure is formed while the substrate heated by the heater is held at the predetermined distance away from the substrate facing surface of the heater, the impedance of an electrically-conductive substrate holding device disposed in a substrate outer peripheral portion is adjusted by an impedance varying mechanism connected to the substrate holding device. The present invention is described below with reference to the drawings. Note that the members, arrangements, and the like described below are specific examples of the present invention and do not limit the present invention. The members, arrangements, and the like may be modified in various ways according to the spirit of the present invention, as a matter of course.

FIGS. 1 to 7 are diagrams of a vacuum processing apparatus (radio-frequency sputtering apparatus) and a LED structure fabricated by using a formed epitaxial film in one embodiment of the present invention. Parts of the vacuum processing apparatus and the LED structure are partially omitted to avoid complication of illustration.

FIG. 1 is a schematic configuration diagram of an example of a sputtering apparatus used to form a group III nitride semiconductor thin film in the present invention. In FIG. 1 illustrating the sputtering apparatus S, reference numeral 101 denotes a vacuum chamber, 102 denotes a target electrode, 99 denotes a substrate holder, 103 denotes a heater, 703 denotes a substrate holding device, 105 denotes a target shield, 106 denotes a radio-frequency power supply, 107 denotes a substrate, 108 denotes a target, 109 denotes a gas introduction mechanism, 110 denotes an exhaust mechanism configured to exhaust air inside the vacuum chamber 101, 112 denotes a reflector, 113 denotes an electrically-insulating material, 114 denotes a chamber shield, 115 denotes a magnet unit, 116 denotes a target shield holding mechanism, 120 denotes a matching box, and 203 denotes a heater electrode. Moreover, reference numeral 750 denotes a holder supporting portion which supports the substrate holding device 703. Reference sign P is an upper surface (substrate facing surface) of the heater 103 which faces the substrate held by the substrate holding device 703 to be described later.

The vacuum chamber 101 is a member made of metal such as stainless steel or aluminum alloy, and is electrically grounded. Moreover, a temperature increase of a wall surface of the vacuum chamber 101 is prevented or suppressed by a not-illustrated cooling mechanism. Furthermore, the vacuum chamber 101 is connected to the gas introduction mechanism 109 via a not-illustrated mass flow controller, and is connected to the exhaust mechanism 110 via a not-illustrated variable conductance valve.

The target shield 105 is attached to the vacuum chamber 101 via the target shield holding mechanism 116. The target shield holding mechanism 116 and the target shield 105 may be members made of metal such as stainless steel or aluminum alloy, and are held at the same DC potential as the vacuum chamber 101.

The target electrode 102 is attached to the vacuum chamber 101 via the electrically-insulating material 113. Moreover, the target 108 is attached to the target electrode 102, and the target electrode 102 is connected to the radio-frequency power supply 106 via the matching box 120. The target 108 may be directly attached to the target electrode 102 or attached to the target electrode 102 via a not-illustrated bonding plate which is a member made of metal such as copper (Cu).

The target 108 may be a metal target containing at least one of Al, Ga, and In or a nitride target containing at least one of the group III elements described above. The target electrode 102 is provided with a not-illustrated cooling mechanism for preventing a temperature increase of the target 108. Moreover, the target electrode 102 includes therein the magnet unit 115. As the radio-frequency power supply 106, a power supply of 13.56 MHz is easy to use in terms of industrial application. However, it is possible to use a power supply of another frequency and to superimpose a direct current on the radio-frequency or use them in pulses.

The chamber shield 114 is attached to the vacuum chamber 101 and prevents the film from adhering to the vacuum chamber 101 in the film formation.

The substrate holder 99 includes the heater 103, the substrate holding device 703 (substrate holding portion), and the reflector 112 as main constitutional components. The heater electrode 203 is provided in the heater 103. At least a portion of the substrate holding device 703 coming into contact with the substrate is an electrically-insulating member and the substrate holding device 703 is fixed by the holder supporting portion 750. The substrate 107 can be disposed with a predetermined gap provided between the substrate 107 and the substrate facing surface P of the heater 103 by being held by the substrate holding device 703. A detailed example of the substrate holding device 703 is described later.

In the embodiment, as illustrated in FIG. 1, the target electrode 102 on which the target can be disposed is disposed in an upper portion of the vacuum chamber 101 in the direction of gravity, and the substrate holder 99 is disposed below the target electrode 102 in the direction of gravity. The substrate 107 can be thus held by the substrate holding device 703 by utilizing gravity. Hence, it is possible to expose an entire film formation surface of the substrate 107 to the target 108 and perform epitaxial film formation on the entire surface of the substrate 107, only by placing the substrate 107 in contact with a substrate supporting portion (reference numeral 704 and the like to be described later) of the substrate holding device 703.

Note that, in the embodiment, description is given of the example in which the target electrode 102 is disposed in the upper portion of the vacuum chamber 101 in the direction of gravity and the substrate holder 99 is disposed below the target electrode 102 in the direction of gravity. However, the arrangement may be such that the substrate holder 99 is disposed in the upper portion of the vacuum chamber 101 in the direction of gravity and the target electrode 102 is disposed below the substrate holder 99 in the direction of gravity.

Figure 2:
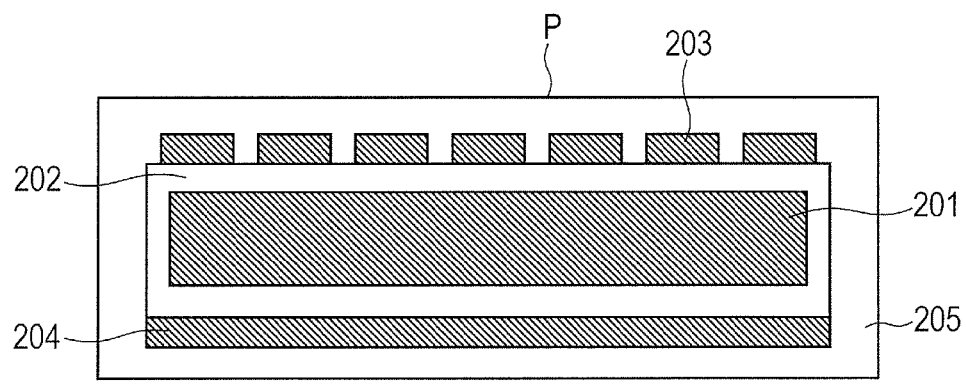
FIG. 2 is a schematic cross-sectional diagram of a heater in one embodiment of the present invention.
Figure 3:
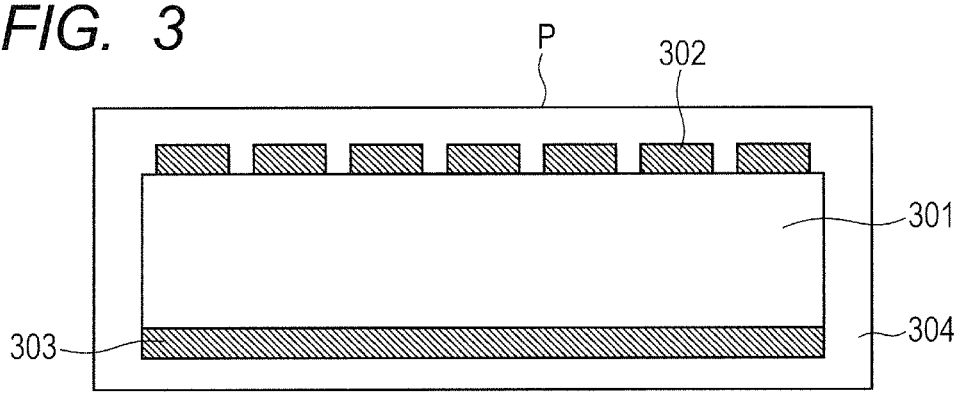
FIG. 3 is another schematic cross-sectional diagram of a heater in one embodiment of the present invention.

FIGS. 2 and 3 illustrate examples of the structure of the heater 103. In FIG. 2, reference numeral 201 denotes a base, 202 denotes a base coat, 203 denotes a heater electrode, 204 denotes a backside coat, and 205 denotes an over coat.

The base 201 is made of graphite, the heater electrode 203 and the backside coat 204 are made of pyrolytic graphite (PG), and the base coat 202 and the over coat 205 are made of pyrolytic boron nitride (PBN). Note that the base coat 202 and the over coat 205 made of PBN are high-resistance materials.

Due to such configuration, the heater 103 can emit infrared of a predetermined wavelength band and heat the substrate to a given temperature.

FIG. 3 illustrates another configuration example of the heater. Reference numeral 301 denotes a base, 302 denotes a heater electrode, 303 denotes a backside coat, and 304 denotes an over coat. The base 301 is made of boron nitride (BN), the heater electrode 302 and the backside coat 303 are made of PG, and the over coat 304 is made of PBN. Note that the base 301 made of BN and the over coat 304 made of PBN are high-resistance materials.

Note that the materials forming the heaters described above are preferably used because the materials can heat the α-Al$_2$O$_3$ substrate at a higher efficiency than a conventional infrared lamp. However, the materials are not limited to those described above as long as the α-Al$_2$O$_3$ substrate can be heated to a predetermined temperature.

Figure 4A:
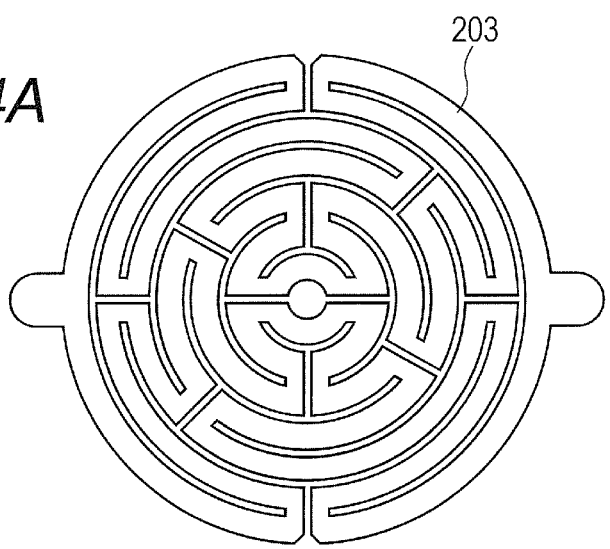
FIG. 4A is a top view illustrating a configuration example of a heater electrode in one embodiment of the present invention.
Figure 4B:
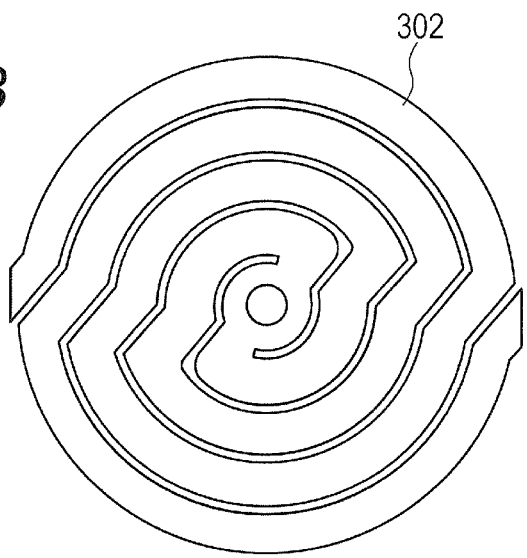
FIG. 4B is a top view illustrating a configuration example of the heater electrode in one embodiment of the present invention.

FIGS. 4A and 4B illustrate configuration examples (top view) of the heater electrode 203 (or 302). The heater electrode 203 (or 302) provided in the heater 103 has an electrode pattern like those illustrated in FIGS. 4A and 4B. Connecting the electrode pattern to a power supply (not illustrated) to apply DC or AC voltage causes an electric current to flow through the heater electrode 203 (or 302) and thus-generated Joule heat heats the heater 103. The substrate is heated by infrared emitted from the heater 103.

By using the electrode patterns as illustrated in FIGS. 4A and 4B, heat can be uniformly applied to the entire surface of the substrate 107. Accordingly, it is preferable to use an electrode pattern which can apply heat to the entire surface of the substrate as uniformly as possible. However, in the invention, it is important that an epitaxial film with +c-polarity can be formed regardless of whether the electrode pattern which can uniformly apply heat to the entire surface of the substrate is used or not, and the shape of the electrode pattern is not essential. Hence, in the embodiment, the electrode pattern is not limited to the electrode patterns illustrated in FIGS. 4A and 4B.

In each of the examples of the structure of the heater 103 illustrated in FIGS. 2 and 3, the surface on the side where the heater electrode 203 or 302 with the pattern illustrated in FIG. 4A or 4B is formed is the substrate facing surface of the heater 103 denoted by reference sign P. However, the heater 103 may have a structure obtained by turning the heater 103 illustrated in FIG. 2 or 3 upside down, that is, the surface opposite to the surface denoted by the reference sign P in FIG. 2 or 3 may be the substrate facing surface. In this case, the substrate is heated via the backside coat 204 or 303. This causes the power efficiency of substrate heating to decrease, but the backside coat 204 or 303 in this case has a role of evening the heat and has an effect of uniformly applying heat to the substrate.

Figure 5:
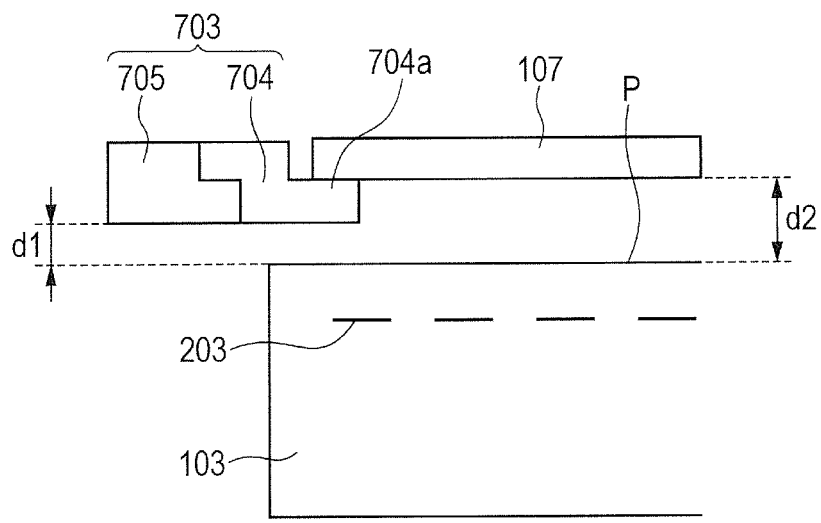
FIG. 5 is a diagram illustrating a configuration example of a substrate holding device in one embodiment of the present invention.

FIG. 5 illustrates a configuration example of a substrate holding device. In FIG. 5, reference numeral 107 denotes the substrate and 703 denotes the substrate holding device. The substrate holding device 703 is a substantially ring-shaped member having a uniform cross section, and includes a first substrate holding device 704 and a second substrate holding device 705. The substrate 107 is placed with the outer peripheral portion of the substrate 107 being in contact with 704a provided in an inner peripheral portion of the first substrate holding device 704. The second substrate holding device 705 supports an outer peripheral portion of the first substrate holding device 704. d2 in the drawings denotes a gap between the substrate facing surface P and a back surface of the substrate 107 disposed on the substrate holding device 703, and d1 denotes a gap between the first substrate holding device 704 and the substrate facing surface P.

Figure 6:
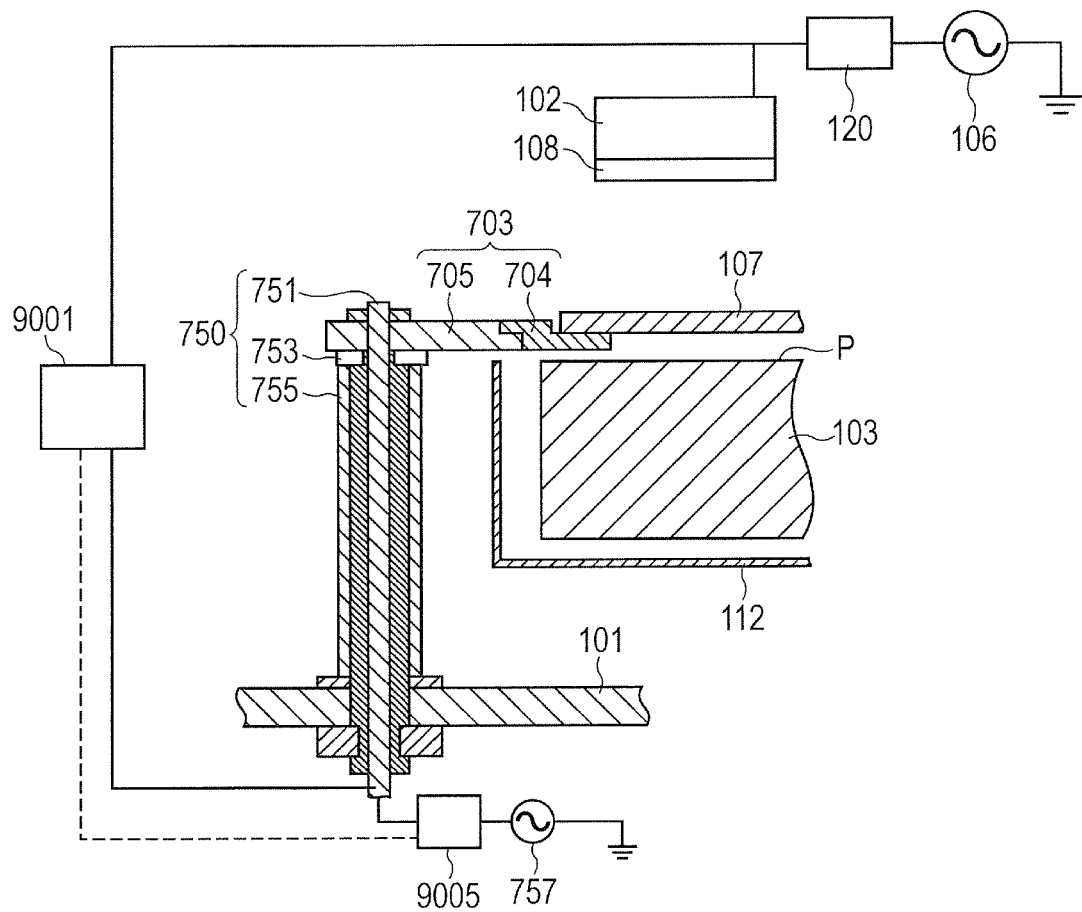
FIG. 6 is a diagram illustrating a configuration example of a supporting portion of the substrate holding device in one embodiment of the present invention.

FIG. 6 is a schematic diagram illustrating a configuration example of a portion supporting the substrate holding device 703. The holder supporting portion 750 is a member supporting the second substrate holding device 705, and includes an electrically-conductive material 751, an electrically-insulating material 753, and a stainless-steel pipe 755 as main constitutional elements. The electrically-conductive material 751 is electrically connected to the second substrate holding device 705 and a radio-frequency power supply 757 provided outside the vacuum chamber 101. A matching box 9005 is provided between the radio-frequency power supply 757 and the electrically-conductive material 751 to be connected thereto. Radio-frequency electric power is thus supplied from the radio-frequency power supply 757 to the second substrate holding device 705 via the electrically-conductive material 751. The electrically-conductive material 751 is covered with the electrically-insulating material 753 and the stainless-steel pipe 755.

Moreover, the electrically-insulating material 753 secures electrical insulation between the electrically-conductive material 751 and the vacuum chamber 101. The electrically-insulating material 753 prevents the stainless-steel pipe 755 and the second substrate holding device 705 from coming into electrical contact with each other. As described above, the holder supporting portion 750 is configured to support the second substrate holding device 705 and to also supply power to the second substrate holding device 705. Accordingly, it is possible to generate plasma near the substrate by supplying radio-frequency power to the second substrate holding device 705 in an atmosphere including gases such as $N_2$ and rare gases and thereby perform surface treatment on the substrate. Moreover, a sensor 9001 is a sensor capable of measuring the DC and radio-frequency voltages of the target electrode 102 and the second substrate holding device 705 in synchronization and, for example, an oscilloscope can be used. Note that the sensor 9001 may be configured to be removable from the sputtering apparatus S and film formation in a film formation step may be performed with the sensor 9001 being removed.

Figure 7:
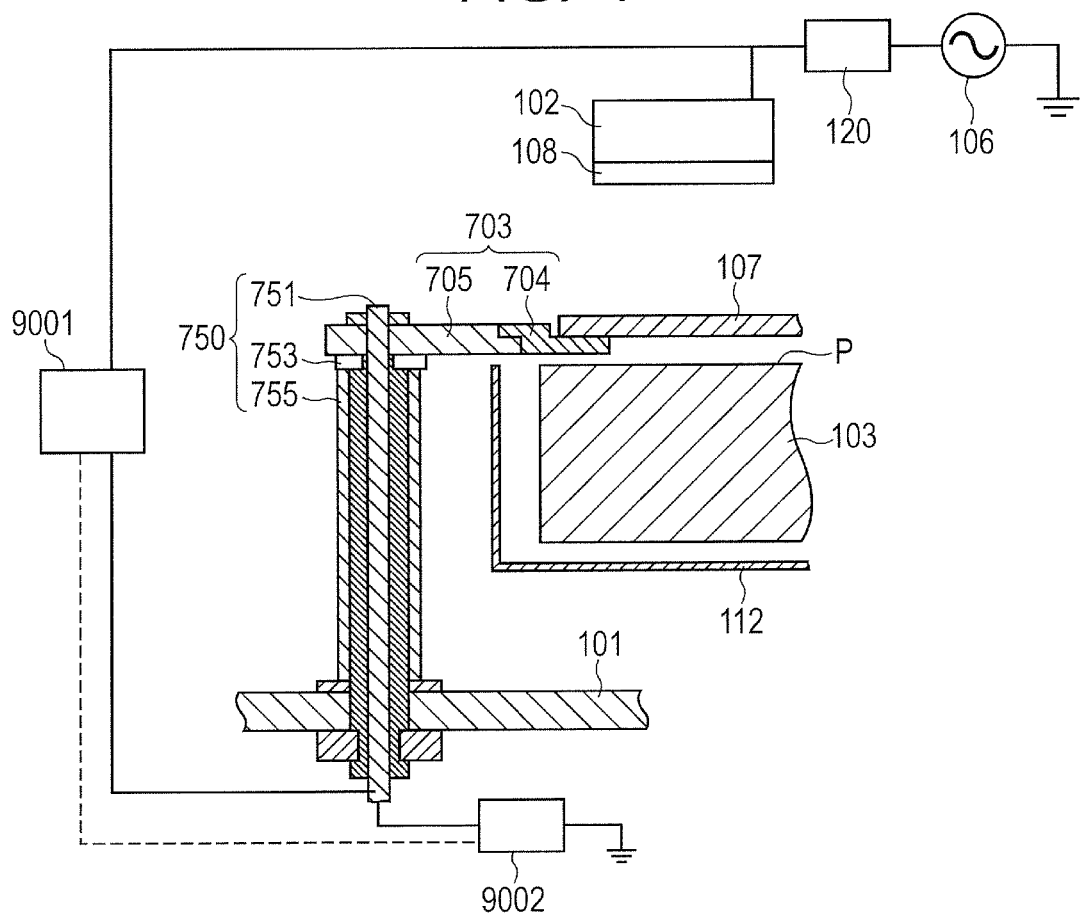
FIG. 7 is a diagram illustrating another configuration example of the supporting portion of the substrate holding device in one embodiment of the present invention.
Figure 8A:
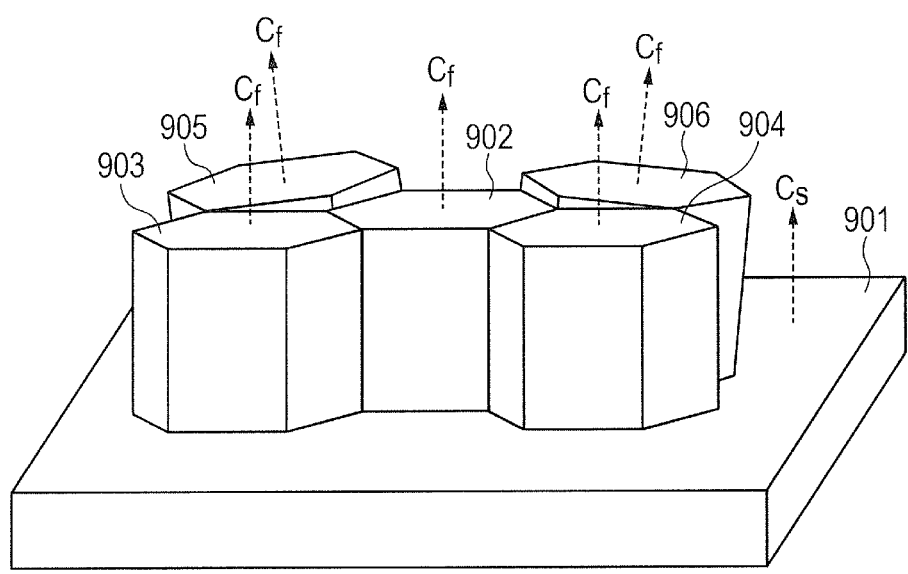
FIG. 8A is a schematic view illustrating tilt and twist mosaic spreads of crystals made of a group III nitride semiconductor.
Figure 8B:
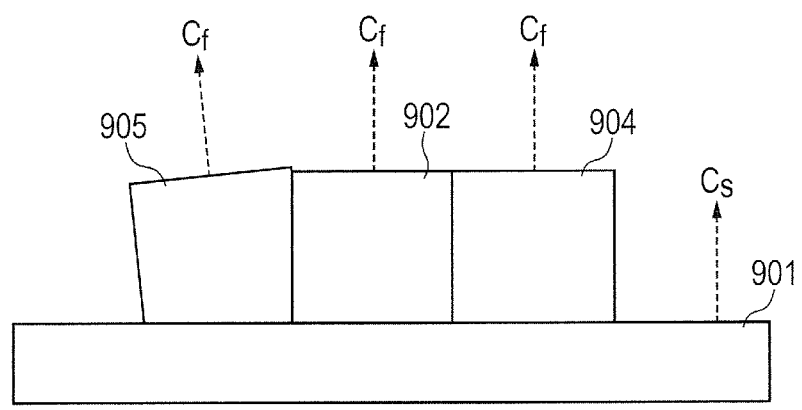
FIG. 8B is a schematic view illustrating the tilt and twist mosaic spreads of the crystals made of the group III nitride semiconductor.
Figure 8C:
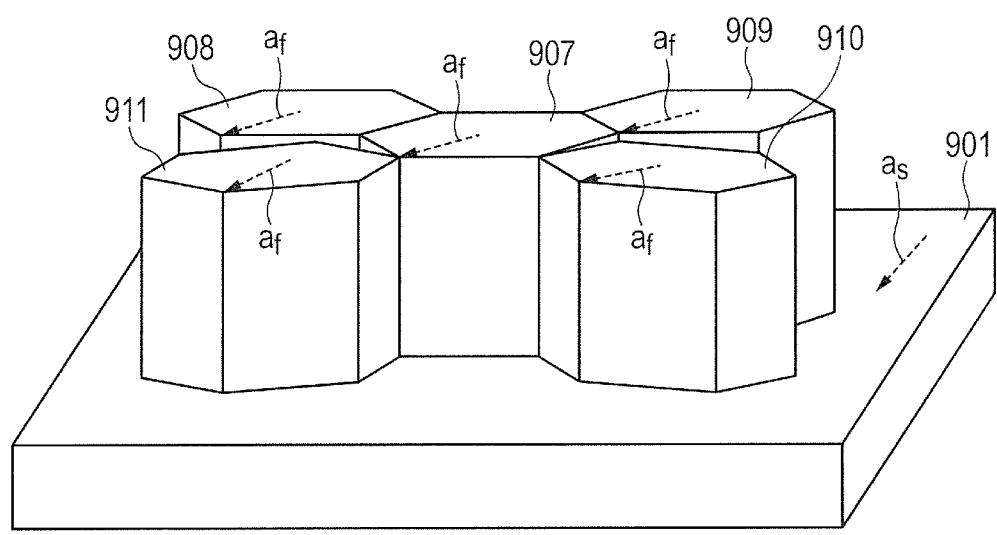
FIG. 8C is a schematic view illustrating the tilt and twist mosaic spreads of the crystals made of the group III nitride semiconductor.
Figure 8D:
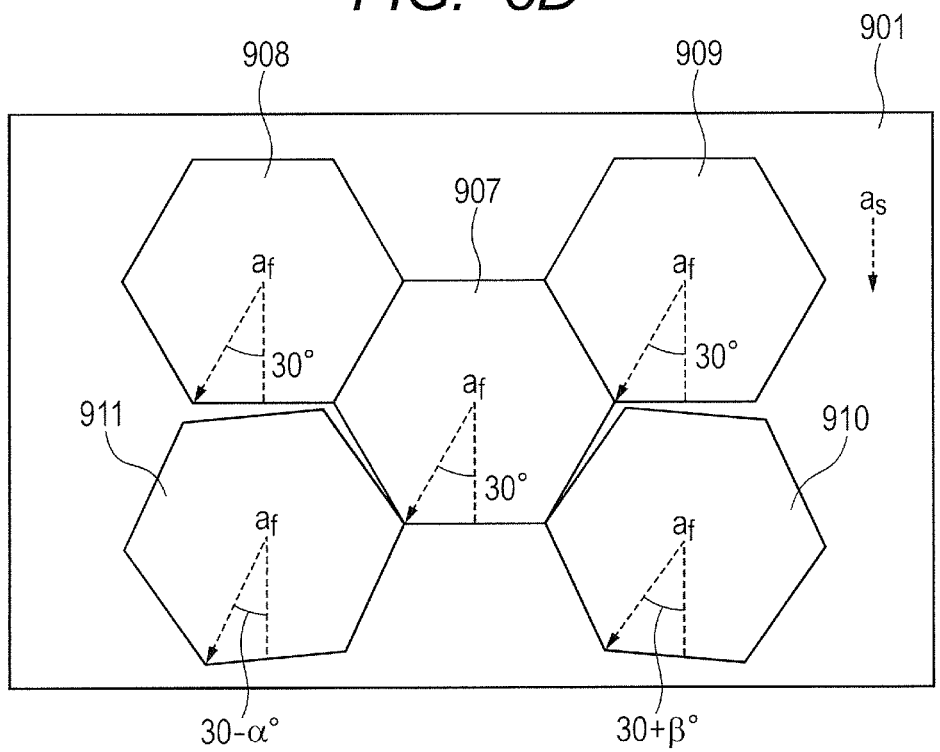
FIG. 8D is a schematic view illustrating the tilt and twist mosaic spreads of the crystals made of the group III nitride semiconductor.
Figure 9:
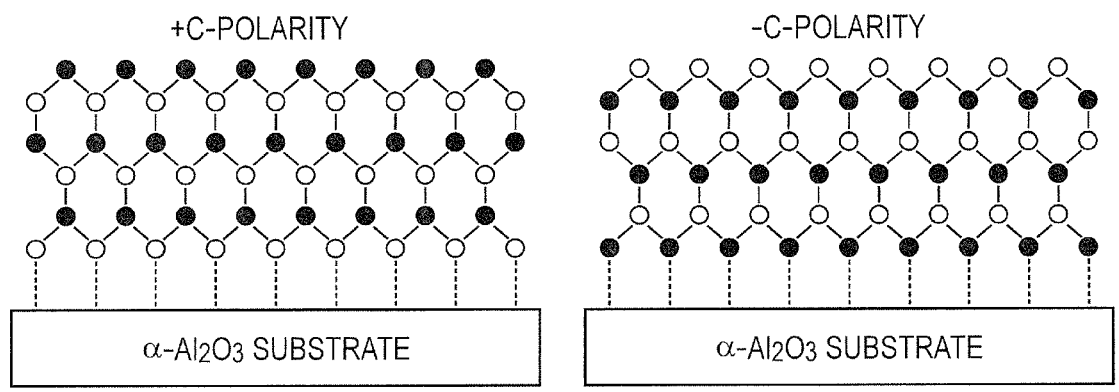
FIG. 9 is a schematic diagram illustrating+c polarity and +c polarity in a group III nitride semiconductor thin film.

Note that, when no surface treatment is performed on the substrate by generating plasma near the substrate, the matching box connected to the second substrate holding device 705 and the radio-frequency power supply connected via the matching box are unnecessary. A configuration example in the case where no radio-frequency power supply is connected to the second substrate holding device 705 is illustrated in FIG. 7. When no radio-frequency power supply is connected to the second substrate holding device 705, only an impedance varying mechanism 9002 serving as an impedance adjuster have to be connected to the second substrate holding device 705. FIG. 7 is described later.

In the present invention, an input route and a return route of the radio-frequency power considered based on plasma can be explained as follows. For example, in FIG. 6, the radio-frequency power supply 106 inputs the radio-frequency power into the target electrode 102 and the target 108 via the matching box 120. The route of this power is referred to as input route. Plasma is generated by the radio-frequency power inputted into the target 108 and can cause the sputtering phenomenon.

Meanwhile, the radio-frequency power returns from the plasma to the ground via the not-illustrated chamber shield (chamber shield 114 in FIG. 1) and the second substrate holding device 705. The route of this power is referred to as return route. When the radio-frequency power returns to the ground via the second substrate holding device 705, the radio-frequency power returns via the electrically-conductive material 751, the matching box 9005, and the radio-frequency power supply 757. A key point of the present invention is a point that the impedance varying mechanism such as the matching box 9005 is provided in the return route to adjust the impedance in the return route of the radio-frequency power based on the plasma and thereby suppress a variation in the state of the plasma and thus a variation in the characteristics of the plasma within an allowable range.

For example, when transition of a certain plasma state occurs due to a certain effect, the certain plasma state can be returned to the original state by adjusting the impedance of the return route from the view point of phase difference. Examples of reasons of transition of the certain plasma state include deposition of the sputtered material on the second substrate holding device 705.

A ring made of an electrically-conductive member and supporting the first substrate holding device 704 in the substrate holding device 703 can be given as an example of an electrode portion whose impedance can be adjusted in the return route.

Moreover, in FIG. 5, the first substrate holding device 704 includes a substrate supporting portion 704a made of an electrically-insulating member for supporting the substrate 107 from below. The gap d1 is provided between the back side of the substrate supporting portion 704a and the substrate facing surface P of the heater 103, and the gap d2 is provided between the substrate 107 and the substrate facing surface P of the heater 103. The gap d1 is desirably 0.4 mm or more and the gap d2 is desirably 0.5 mm or more. When the gap d1 is less than 0.4 mm, the group III nitride semiconductor thin film with mixed polarities is likely to be formed in the outer peripheral portion. Meanwhile, when the gap d2 is less than 0.5 mm, the group III nitride semiconductor thin film with mixed polarities is likely to be formed over the entire substrate surface. Accordingly, these cases are not preferable.

Note that increasing the gaps d1 and d2 too much is not preferable because the efficiency of heating the substrate 107 with the heater 103 decreases as the gaps d1 and d2 increase. Moreover, increasing the gaps d1 and d2, particularly d2 too much causes generation of plasma in a space between the heater 103 and the substrate 107 and the effect of the present invention may be lost in some cases. Accordingly, it is desirable to set the gaps d1 and d2 to 5 mm or less, more preferably, 2 mm or less.

When the power supply to the second substrate holding device 705 is unnecessary, the electrically-conductive material 751 does not necessary require the matching box 9005 and the radio-frequency power supply 757 connected via the matching box 9005. For example, as illustrated in FIG. 7, instead of the matching box 9005 and the radio-frequency power supply 757, only the impedance varying mechanism 9002 needs to be connected to the electrically-conductive material 751.

In this case, the radio-frequency power returning to the ground via the substrate holding device 703 returns to the ground via the electrically-conductive material 751 and the impedance varying mechanism 9002. Also in the return route via the impedance varying mechanism, it is possible to adjust the impedance in the return route of the radio-frequency power based on the plasma and thereby suppress the variation in the plasma state and thus the variation in the characteristic of the plasma within the allowable range. The ring made of the electrically-conductive member and supporting the first substrate holding device 704 in the substrate holding device 703 can be given as an example of the electrode portion whose impedance can be adjusted in the return route.

FIG. 7 illustrates a configuration example in which no radio-frequency power supply is connected to the second substrate holding device 705. In this case, it is desirable to attach the sensor 9001 capable of monitoring the DC and/or radio-frequency voltages induced in the target electrode 102 and the second substrate holding device 705. The sensor 9001 desirably has a configuration capable of measuring the DC and radio-frequency voltages of the target electrode 102 and the second substrate holding device 705 in synchronization. Relationships between the DC and/or radio-frequency voltage induced in the target electrode 102 and the DC and/or radio-frequency voltage induced in the second substrate holding device 705 can be thereby checked. More specifically, it is possible to check the relationship between the DC voltage induced in the target electrode 102 and the DC voltage induced in the second substrate holding device 705. Furthermore, it is possible to check the phase difference (potential phase difference) between the radio-frequency voltage induced in the target electrode 102 and the radio-frequency voltage induced in the second substrate holding device 705. In addition, it is possible to check the relationship between the amplitudes of the radio-frequency voltage induced in the target electrode 102 and the radio-frequency voltage induced in the second substrate holding device 705. Using such a configuration enables adjustment of the capacitances of variable capacitors included in the impedance varying mechanism (impedance adjuster) such that the impedance of the second substrate holding device 705 does not vary greatly from one treated substrate to another. Accordingly, it is possible to prevent the proportion of +c polarity in the epitaxial film with the wurtzite structure from varying from one treated substrate to another, and achieve stable quality.

In the configuration example of the substrate holding device illustrated in FIG. 7, although the ring-shaped electrically-insulating member is used as the substrate supporting portion 704a, the substrate supporting portion 704a is not limited to the ring-shaped member. For example, the substrate supporting portion 704a may be a plate-shaped electrically-insulating member with no opening portion being formed. In this case, the substrate supporting portion is disposed with a predetermined gap (for example, d1) provided between the substrate supporting portion and the heater 103 as a matter of course. However, forming the substrate supporting portion in the ring shape as in the embodiment enables the substrate 107 to be exposed to the heater 103 with the predetermined gap provided between the substrate 107 and the substrate facing surface P of the heater 103. Accordingly, the substrate 107 can be efficiently heated, and forming the substrate supporting portion in the ring shape is thus preferable.

Moreover, for example, quartz, sapphire, alumina, BN, and the like can be used as the electrically-insulating member used for the substrate supporting portion 704a.

The structure illustrated in FIG. 7 may be used as the structure of the substrate holding device 703 or a substrate holding device with another structure may be used. The key point of the embodiment is to dispose the substrate at the predetermined distance away from the substrate facing surface P of the heater in the formation of the group III nitride semiconductor thin film. In the embodiment, the space between the substrate and the substrate facing surface P of the heater is a gap. However, similar effects are assumed to be obtained when the gap is filled with an electrically-insulating member. Accordingly, the substrate holding device is not limited to the configuration of FIG. 5 and may have any structure, provided that the structure is capable of disposing the substrate at the predetermined distance away from the substrate facing surface P of the heater. For example, in the case of a device having a mechanism which receives and hands over the substrate by lifting and lowering a lift pin, the lift pin may be used to hold the substrate at a position where there is a predetermined gap between the substrate and the substrate facing surface P of the heater 103. In this case, however, the material of the film enters the gap between the outer periphery of the substrate and the heater 103 and adheres to the substrate facing surface P of the heater 103, which causes the radiation from the heater 103 to vary over time. Accordingly, the embodiment is a desirable mode.

In the configurations of FIGS. 6 and 7 described above, the second substrate holding device 705 being the electrode portion whose impedance can be adjusted is configured as the ring made of the electrically-conductive member and supporting the first substrate holding device 704. However, a conductive ring whose impedance can be adjusted may be provided around the first substrate holding device 704 and used as the electrode portion. In this case, the impedance varying mechanism (impedance adjuster) 9002, 9005 and the radio-frequency power supply are connected to the electrode portion provided in the outer peripheral portion of the first substrate holding device 704. The electrode portion whose impedance can be adjusted is located desirably in the outer peripheral portion of the substrate at the film formation position. Furthermore, the thickness of the first substrate holding device 704 may be partially changed to have such a shape that the gap d1 is provided between the back side (side facing the heater 103) of the first substrate holding device and the substrate facing surface P of the heater 103 and the gap d2 is provided between the substrate 107 and the substrate facing surface P of the heater 103 when the first substrate holding device is disposed on the substrate facing surface P of the heater 103.

Moreover, before the formation of the group III nitride semiconductor thin film, plasma near the substrate may be generated by using the radio-frequency power supply 757 connected to the second substrate holding device 705 illustrated in FIG. 6 to remove components such as moisture and hydrocarbon adhering to the substrate surface. Furthermore, the structure of the heater electrode may use any of the patterns illustrated in FIGS. 4A and 4B or use a pattern of another structure as described above.

A film formation method (epitaxial formation method) of forming the group III nitride semiconductor thin film having the wurtzite structure by using a sputtering apparatus in one embodiment of the present invention is described below with reference to the drawings. In the embodiment, an epitaxial film is formed on the $\alpha\text{-}Al_2O_3$ substrate by a method including first to fifth steps described below. Note that, although description is given of the film formation method of forming the group III nitride semiconductor thin film having the wurtzite structure in the embodiment, the film formation method in the embodiment may be applied to formation of the ZnO-based semiconductor thin film on the $\alpha\text{-}Al_2O_3$ substrate as a matter of course.

First, as the first step (substrate transporting step), the substrate 107 is introduced into the vacuum chamber 101 maintained at a predetermined pressure by the exhaust mechanism 110. In this case, a not-illustrated transport robot transports the substrate ($\alpha$-$Al_2O_3$ substrate) 107 to a position above the heater 103 and places the substrate 107 on an upper portion of a not-illustrated lift pin protruding from the heater 103 (substrate transport). Thereafter, the lift pin holding the substrate 107 is lowered and the substrate 107 is disposed on the substrate holding device 703.

Next, as the second step (substrate heating step), the voltage to be applied to the heater electrode 203 provided in the heater 103 is controlled to maintain the substrate 107 at a predetermined temperature. In this case, the temperature of the heater 103 is monitored by using a thermocouple (not illustrated) included in the heater 103 or a not-illustrated pyrometer installed in the vacuum chamber 101 and is controlled to be set to the predetermined temperature.

Next, as the third step, the gas introduction mechanism 109 introduces any of a $N_2$ gas, a rare gas, a mixed gas of the $N_2$ gas and the rare gas into the vacuum chamber 101, and the mass flow controller (not illustrated) and the variable conductance valve (not illustrated) set the pressure in the vacuum chamber 101 to a predetermined pressure.

Next, as the fourth step, the impedance of the second substrate holding device 705 is adjusted. In the case of using the substrate holding device illustrated in FIG. 6, the impedance of the second substrate holding device 705 is desirably adjusted by using the matching box 9005. Meanwhile, in the case of using the substrate holding device illustrated in FIG. 7, the impedance of the second substrate holding device 705 is desirably adjusted by using the impedance varying mechanism 9002. In the cases of using the substrate holding devices illustrated in FIGS. 6 and 7, the sensor 9001 capable of monitoring the DC and/or radio-frequency voltages induced in the target electrode 102 and the second substrate holding device 705 is desirably attached to the substrate holding devices.

The sensor 9001 desirably has a configuration capable of measuring the DC and radio-frequency voltages of the target electrode 102 and the second substrate holding device 705 in synchronization. This configuration enables checking of the relationships between the DC and/or radio-frequency voltage induced in the target electrode 102 and the DC and/or radio-frequency voltage induced in the second substrate holding device 705. More specifically, it is possible to check the relationship between the DC voltage induced in the target electrode 102 and the DC voltage induced in the second substrate holding device 705. Furthermore, it is possible to check the phase difference (potential phase difference) between the radio-frequency voltage induced in the target electrode 102 and the radio-frequency voltage induced in the second substrate holding device 705. In addition, it is possible to check the relationship between the amplitudes of the radio-frequency voltage induced in the target electrode 102 and the radio-frequency voltage induced in the second substrate holding device 705. Using such a configuration enables adjustment of the capacitances of the variable capacitors included in the impedance varying mechanism 9002 such that the impedance of the second substrate holding device 705 does not vary greatly from one treated substrate to another.

Note that the adjustment of the capacitances of the variable capacitors may be performed before or during the fifth step (film formation step) to be described below. When the adjustment of the capacitances of the variable capacitors is performed before the fifth step (film formation step), for example, adjustment values of the capacitor capacitances are preferably predetermined based on measurement results of the sensor 9001 such that a desirable potential phase difference is achieved. Note that, in order to respond to the change in the potential phase difference over time, the adjustment values of the capacitor capacitances are preferably determined for each of predetermined levels of integral power.

Figure 11:
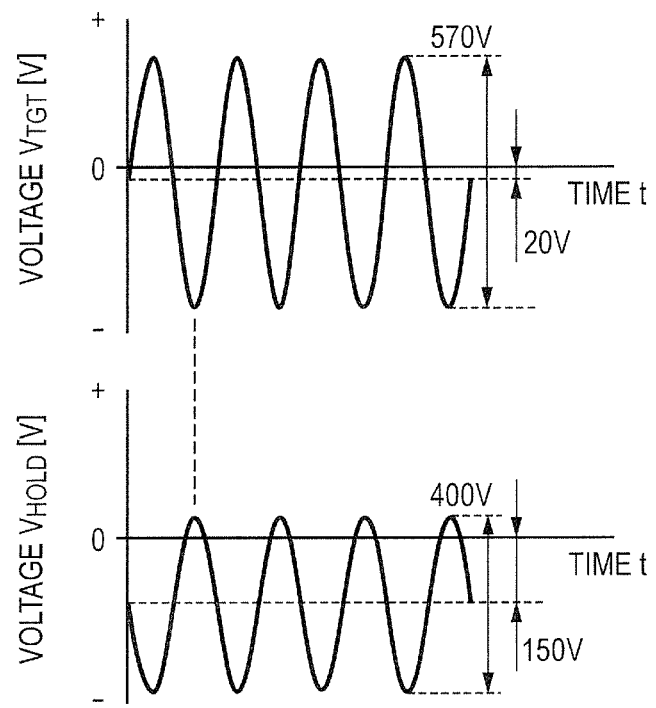
FIG. 11 is a schematic diagram illustrating an example of a relationship between a voltage induced in a target electrode and a voltage induced in a second substrate supporting device in the present invention.

As another adjustment method, when the adjustment of the capacitances of the variable capacitors is performed during the fifth step (film formation step), for example, the film formation is preferably performed while adjusting the capacitors such that a desirable potential phase difference is achieved. The capacitor capacitances of the impedance adjustment devices (impedance adjustors) 9002 and 9005 are preferably adjusted such that a waveform measured by the sensor 9001 becomes, for example, the waveform as illustrated in FIG. 11.

Lastly, as the fifth step (film formation step), the radio-frequency power supply 106 applies the radio-frequency power to generate radio-frequency plasma in front of the target 108, and the element forming the target 108 is ejected by the ions in the plasma to form the group III nitride semiconductor thin film. When a metal target is used as the target 108, the $N_2$ gas or the mixed gas of the $N_2$ gas and the rare gas is preferably used as a process gas. In this case, a group-III element forming the metal target is nitrided in at least one of regions including the surface of the target 108, the surface of the substrate 107, and the space between the target 108 and the substrate 107 to form the group III nitride semiconductor thin film on the substrate. Note that, although the power supply connected to the target electrode 102 is the radio-frequency power supply 106 in the embodiment, it is possible to employ a method of connecting a radio-frequency power supply and a DC power supply in parallel and superimposing DC power on radio-frequency power. In this case, it is preferable to provide a low-pass filter between the DC power supply and the target electrode 102 to prevent the radio-frequency power from being inputted into the DC power supply.

Meanwhile, when a nitride target is used, any one of the $N_2$ gas, the rare gas, the mixed gas of the $N_2$ gas and the rare gas is preferably used, and sputtering particles are ejected from the target surface in a form of atoms or nitride molecules. The group-III element ejected from the target surface as atoms is nitrided in at least one of the regions including the surface of the target 108, the surface of the substrate 107, and the space between the target 108 and the substrate 107 to form the group III nitride semiconductor thin film on the substrate. Meanwhile, most of the nitride molecules ejected from the target surface reach the substrate and form the group III nitride semiconductor thin film.

Some of the nitride molecules ejected from the target surface may be dissociated on the surface of the substrate 107 or in the space between the target 108 and the substrate 107. However, the group-III element generated by the dissociation is nitrided again in at least one of the surface of the substrate 107 and the space between the target 108 and the substrate 107 and forms the group III nitride semiconductor thin film.

The predetermined pressure in the first step is desirably less than $5\times10^{-4}$ Pa. When the predetermined pressure is $5\times10^{-4}$ Pa or higher, impurities such as oxygen are incorporated into the group III nitride semiconductor thin film and a favorable epitaxial film is less likely to be obtained. Moreover, although the temperature of the heater 103 in the first step is not limited to a particular temperature, the temperature of the heater 103 is desirably set to a temperature for achieving a substrate temperature in the film formation, from the view point of productivity.

The predetermined temperature in the second step is desirably set to a film formation temperature in the fifth step from the view point of productivity, and the predetermined pressure in the third step is desirably set to a film formation pressure in the fifth step from the view point of productivity. The timings of performing the second step and the third step may be interchanged or the second step and the third step may be performed simultaneously. Moreover, the temperature set in the second step and the pressure set in the third step are desirably maintained at least until the start of the fifth step, from the view point of productivity.

The substrate temperature in the fifth step is desirably set within a range of 100° C. to 1200° C., more preferably within a range of 400° C. to 1000° C. When the substrate temperature is lower than 100° C., a film with mixed amorphous structures is likely to be formed. When the substrate temperature is higher than 1200° C., the film itself is not formed or, even if the film is formed, an epitaxial film with many defects due to heat stress is likely to be formed. Moreover, the film formation pressure in the fifth step is desirably set within a range of 0.1 to 100 mTorr ($1.33 \times 10^{-2}$ to $1.33 \times 10^{1}$ Pa), more preferably within a range of 1.0 to 10 mTorr ($1.33 \times 10^{1}$ to $1.33 \times 10$ Pa).

When the pressure is lower than 0.1 mTorr ($1.33 \times 10^{-2}$ Pa), high-energy particles are likely to be incident on the substrate surface, and this hinders the obtaining of the favorable group III nitride semiconductor thin film. The pressure higher than 100 mTorr ($1.33 \times 10^{1}$ Pa) is not preferable because the film formation speed becomes very slow. At the start of the fourth step, generation of plasma may be promoted by temporarily increasing the pressure inside the vacuum chamber 101 to a pressure higher than the film formation pressure. In this case, the pressure may be increased from the film formation pressure by temporarily increasing the flow rate of at least one type of gas in the process gas to introduce more gas or by temporarily reducing the opening degree of the variable conductance valve (not illustrated).

Furthermore, a step of transporting the substrate 107 into a preprocessing chamber (not illustrated) and performing heat treatment and plasma treatment on the substrate 107 at a temperature higher than the film formation temperature may be included before the first step as a matter of course.

First Example

Figure 14A:
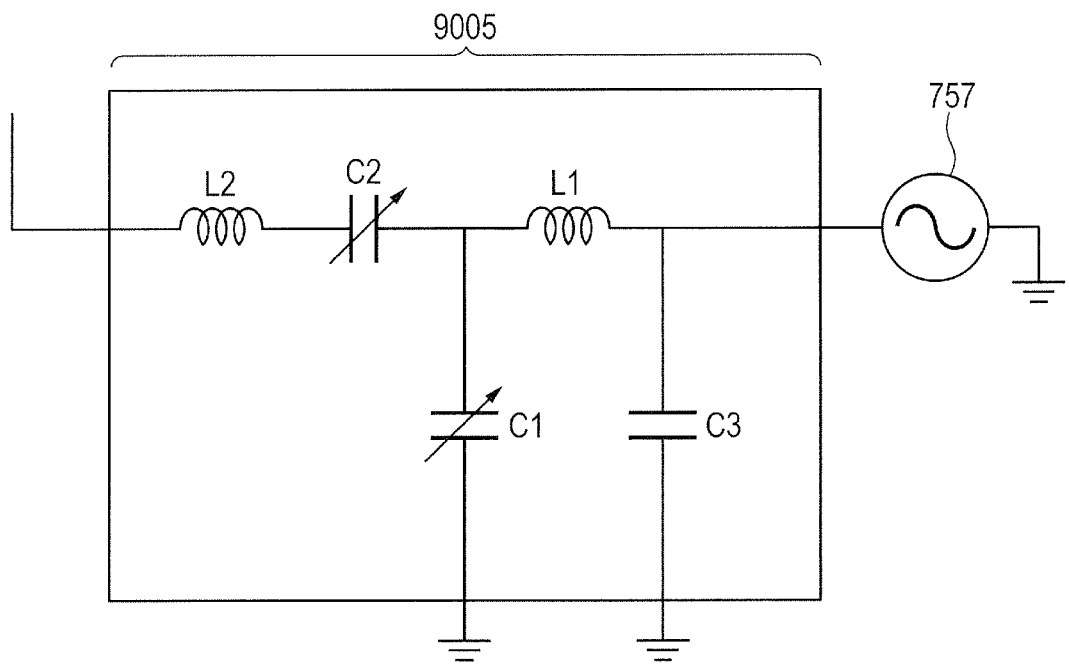
FIG. 14A is a configuration example of a circuit diagram of an impedance varying mechanism in one embodiment of the present invention.

As a first example of the present invention, description is given of an example of forming an AlN film on the $\alpha$-Al$_2$O$_3$ (0001) substrate by using the film formation method of forming the group III nitride semiconductor thin film having the wurtzite structure in one embodiment of the present invention, to be more specific, an example in which the AlN film having the wurtzite structure is formed on the $\alpha$-Al$_2$O$_3$ (0001) substrate by using the sputtering method with the impedance of the second substrate holding device being adjusted, the $\alpha$-Al$_2$O$_3$(0001) substrate placed with the gap provided between the substrate and the substrate facing surface of the heater by the substrate holding device. Note that, in this example, the AlN film was formed by using the sputtering apparatus as illustrated in FIG. 1, and there were used the structure of the heater illustrated in FIG. 2, the pattern of the heater electrode illustrated in FIG. 4A, the substrate holding device illustrated in FIG. 5, and the holder supporting portion illustrated in FIG. 6. A circuit diagram of the matching box 9005 illustrated in FIG. 6 is depicted in FIG. 14A. Moreover, the gap d1 between the substrate supporting portion 704a and the substrate facing surface P of the heater 103 in FIG. 5 was mm and the gap d2 between the substrate 107 and the substrate facing surface P of the heater 103 in FIG. 5 was 2 mm.

In the example, first, in the first step, the $\alpha$-Al$_2$O$_3$(0001) substrate was transported into the vacuum chamber 101 maintained at a pressure of $1 \times 10^{-4}$ Pa or less and disposed on the substrate holding device 703. In the second step, the substrate was maintained at 550° C. which was the film formation temperature in the fifth step. In this case, the heater 103 was controlled such that the monitored value of the thermocouple provided therein was 750° C. Next, in the third step, a mixed gas of N$_2$ and Ar was introduced such that N$_2$/(N$_2$+Ar) was 20%, and the pressure in the vacuum chamber 101 was set to 3.75 mTorr (0.5 Pa) which was the film formation pressure in the fifth step. Next, there was used the matching box 9005 including, as illustrated in FIG. 14A, a variable capacitor C1 of 219 to 1370 pF, a variable capacitor C2 of 80.5 to 480 pF, a fixed capacitor C3 of 4.7 pF, a coil L2 of 0.886 µH, and a coil L1 of 0.35 µH. First, C1 was set to 1370 pF and C2 was set to 144.42 pf. In this condition, in the fifth step, the radio-frequency power supply 106 applied the radio-frequency power of 2000 W to the target 108 made of metal Al, and the AlN film with a film thickness of 50 nm was formed on the substrate by the sputtering method. The adjustment value of each of the variable capacitors was a value predetermined based on the measurement results of the sensor 9001.

The relationship between the voltage induced in the target electrode and the voltage induced in the second substrate supporting device which were measured by the sensor 9001 in this case is illustrated in FIG. 11. Note that, although FIG. 11 illustrates conceptual diagrams of sine waveforms to facilitate understating of the phenomenon, the sine waveforms are not necessary measured. In FIG. 11, voltage $V_{TGT}$ is the voltage induced in the target electrode and voltage $V_{HOLD}$ is the voltage induced in the second substrate supporting device. Moreover, the voltage waveforms in FIG. 11 are displayed with the radio-frequency voltage and the DC voltage being superimposed.

As apparent from FIG. 11, the radio-frequency voltage induced in the target electrode and the radio-frequency voltage induced in the second substrate supporting device had a substantially-opposite phase relationship. Moreover, the DC voltage induced in the target electrode was about −20 V and the DC voltage induced in the second substrate supporting device was about −150 V. Furthermore, the amplitude of the radio-frequency voltage induced in the target electrode was about 570 V and the amplitude of the radio-frequency voltage induced in the second substrate supporting device was about 400 V.

Note that the film formation temperature in the example was set by measuring in advance the substrate temperature of an $\alpha$-Al$_2$O$_3$(0001) substrate in which a thermocouple was embedded and by using relationship between the temperature of the $\alpha$-Al$_2$O$_3$(0001) substrate and the monitored value of the thermocouple provided in the heater, that is, the temperature of the heater in this measurement.

In the embodiment, the fabricated AlN film was evaluated by performing X-ray diffraction (XRD) measurement in a 2θ/ω scan mode at symmetric reflection positions, XRC measurement in an ω scan mode for a symmetric plane, XRC measurement in a φ scan mode in an in-plane arrangement, and coaxial impact collision ion scattering spectroscopy (CAICISS) measurement. In this case, the XRD measurement in the 2θ/ω scan mode at the symmetric reflection positions was used to check the crystalline orientation, and the XRC measurement in the ω scan mode for the symmetric plane and the XRC measurement in the φ scan mode in the in-plane arrangement were used to evaluate the tilt mosaic spread and the twist mosaic spread, respectively. Moreover, the CAICISS measurement was used as means for determining the polarity.

First, the XRD measurement in the 2θ/ω scan mode at the symmetric reflection positions was performed on the AlN film fabricated in the example, with the measurement range being set to a range of 2θ=20° to 60°. In this case, only the diffraction peaks of an AlN plane (0002) and an α-Al$_2$O$_3$ (0006) plane were observed, and diffraction peaks indicating other lattice planes of AlN were not observed.

From this, it was found that the obtained AlN film was oriented along the c-axis.

Next, the XRC measurement in the ω scan mode for the symmetric plane was performed on the AlN film of the example. Note that the AlN plane (0002) was used in the measurement. The FWHM of the obtained XRC profile was 450 arcsec or smaller when a detector was in an open detector state and was 100 arcsec or smaller when an analyzer crystal was inserted in the detector. Hence, it was confirm that the tilt mosaic spread in the fabricated AlN film was very small. Moreover, depending on fabrication conditions, it is possible to obtain an AlN film in which the FWHM is 20 arcsec or smaller in the XRC measurement performed with the analyzer crystal being inserted in the detector.

Note that the XRC measurement should be performed with the detector being set in the open detector state. However, when the film thickness of the sample is small as in this example, the FWHM of the XRC profile increases due to the thickness effect and the lattice relaxation and correct evaluation of the mosaic spread becomes difficult. Therefore, in recent years, the XRC measurement performed with the analyzer crystal inserted in the detector as described above is also regarded as the XRC measurement in a broad sense. In the following description, the open detector state is used in the XRC measurement unless otherwise noted.

Next, the XRC measurement in the φ scan mode in the in-plane arrangement was performed on the AlN film of the embodiment. Note that an AlN {10–10} plane was used in the measurement. It was confirmed that six diffraction peaks appeared at intervals of 60° in the obtained XRC profile and thus the AlN film had six-fold symmetry, that is, the AlN film was epitaxially grown. Moreover, it was found that the FWHM obtained from the diffraction peak with the highest intensity was 2.0° or smaller and the twist mosaic spread of the fabricated AlN film was relatively small. Note that, by comparing the in-plane crystalline orientations of the α-Al$_2$O$_3$(0001) substrate and the AlN film, it was confirmed that the a-axis of the AlN film was turned in the plane by 30° with respect to the a-axis of the α-Al$_2$O$_3$(0001) substrate. This indicates that the AlN film was formed with an epitaxial relationship generally seen when the AlN film was epitaxially grown on the α-Al$_2$O$_3$(0001) substrate.

Figure 10:
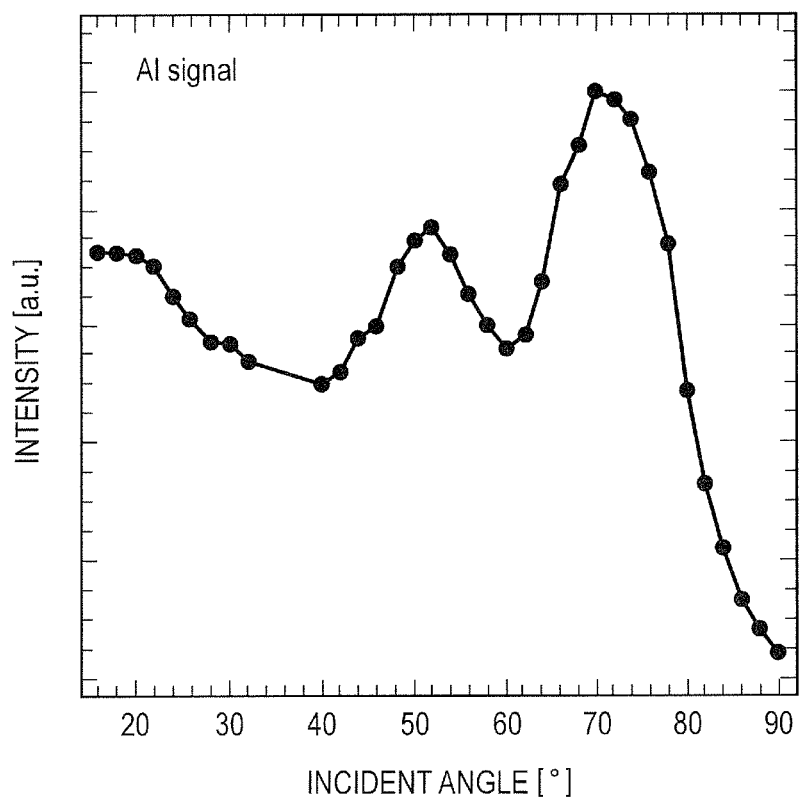
FIG. 10 is a graph illustrating a result of measuring the group III nitride semiconductor thin film by CAICISS measurement in one embodiment of the present invention.

FIG. 10 is a result of the CAICISS measurement on the AlN film of the example. In this measurement, an Al signal was detected while varying the incident angle from the AlN [11–20] direction, and it was found that the peak near the incident angle of 70° was obtained to have a single peak shape. This indicates that the obtained AlN film substantially had+c polarity (Al polarity).

Note that the CAICISS measurement is not suitable for detecting a minute amount of polarity inversion.

Specifically, when+c polarity locally exists in an AlN film in which+c polarity is dominant,+c polarity may not be detectable. In view of this, the obtained AlN film was subjected to etching with NaOH solution which is known to etch a+c polarity portion at a higher rate than a+c polarity portion. As a result, pits were hardly formed in the AlN film. Accordingly, it was considered that almost no+c polarity portions were formed in the obtained AlN film.

Figure 12:
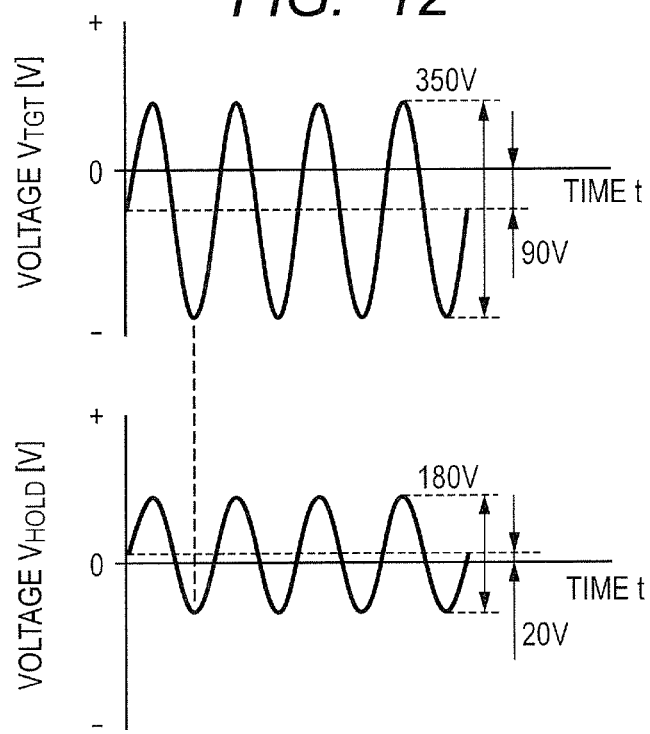
FIG. 12 is a schematic diagram illustrating an example of the relationship between the voltage induced in the target electrode and the voltage induced in the second substrate supporting device in the present invention.

Next, the sputtering process was continuously performed by using a dummy substrate under the same conditions as those described above and the AlN film was formed again on the α-Al$_2$O$_3$(0001) substrate at a point where the total power reached about 100 kWh. FIG. 12 illustrates a relationship between the voltage induced in the target electrode and the voltage induced in the second substrate supporting device detected by the sensor 9001 in this case.

As apparent from FIG. 12, the radio-frequency voltage induced in the target electrode and the radio-frequency voltage induced in the second substrate supporting device had substantially the same phase relationship. Moreover, the DC voltage induced in the target electrode was about −90 V and the DC voltage induced in the second substrate supporting device was about +20 V. The AlN film obtained in such a state was measured by CAICISS and it was found that the AlN film had substantially+c polarity. Moreover, the AlN film was etched with the NaOH solution, and relatively many pits were confirmed. Accordingly, it was considered that, although the obtained AlN film had+c polarity as a whole,+c polarity portions locally existed. This is considered due to variation in the impedance of the second substrate supporting device over time which is caused by deposition of the AlN film on the second substrate supporting device.

Thereafter, the relationship between the voltage induced in the target electrode and the voltage induced in the second substrate supporting device was checked with the sensor 9001 while varying the C1 and the C2. A state substantially the same as that in FIG. 11 was obtained by setting the C1 to 1370 pF and the C2 to 142.42 pF. An AlN film was formed in this state and it was found that the formed AlN film was an AlN film which was determined to have substantially+c polarity in the CAICISS measurement and in which almost no pits were confirmed in the etching with the NaOH solution, that is, an AlN film in which almost no+c polarity portions existed. In other words, an AlN film similar to the AlN film obtained in the state of FIG. 11 can be obtained by adjusting the C1 and the C2 of the matching box 9005. Accordingly, it is possible to increase the reproducibility of the polarity of the AlN film.

Figure 13:
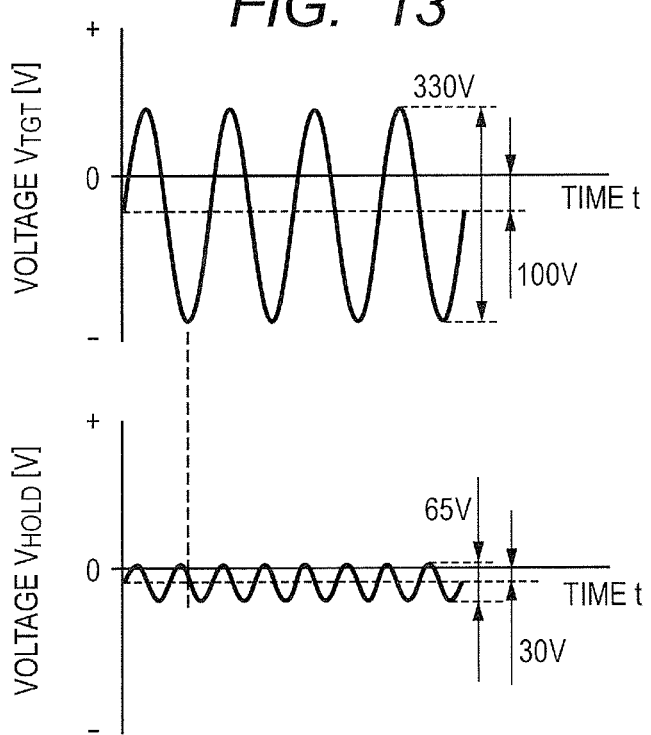
FIG. 13 is a schematic diagram illustrating an example of the relationship between the voltage induced in the target electrode and the voltage induced in the second substrate supporting device in the present invention.

Note that, although description is given of the case where the relationship between the voltage induced in the target electrode and the voltage induced in the second substrate supporting device is the opposite phase or the same phase in the example, the relationship between the voltages is not limited to this. For example, it is found that, when the C1 is set to 995.93 pF and the C2 is set to 140.43 pF, performing the formation of the AlN film repeatedly causes the voltage induced in the target electrode and the voltage induced in the second substrate supporting device to change from the state similar to that in FIG. 11 to the state of FIG. 13. In FIG. 13, a radio-frequency voltage with substantially twice the frequency of the radio-frequency voltage induced in the target electrode is induced in the second substrate supporting device. Also in this case, it is possible to return to the state of FIG. 11 by using a method similar to that described above. In other words, it is possible to increase the reproducibility of the polarity of the AlN film.

From the above, it is found that the AlN film of the example is a c-axis oriented epitaxial film with +c polarity (Al polarity) in which the tilt mosaic spread is very small.

Moreover, stable polarity of the AlN film can be achieved by adjusting the impedance of the second substrate supporting device with the matching box. In other words, it is apparent that the present invention can provide the group III nitride semiconductor thin film with +c polarity with excellent reproducibility while reducing the tilt and twist mosaic spreads.

First Comparative Example

As a first comparative example of the present invention, description is given of an example in which the AlN film is formed on the α-$Al_2O_3$ (0001) substrate by using the sputtering method without performing the adjustment of the impedance of the second substrate supporting device which is the characteristic of the present invention. Note that, in this comparative example, the formation of AlN film was performed by using the same sputtering apparatus, heater, and heater electrode as those in the first example and was the same except for the point that the impedance of the second substrate supporting device was not adjusted. Moreover, film formation conditions of the AlN film were the same as those in the first example.

In the comparative example, an AlN film formed first was confirmed to be an AlN film with few pits in the etching with the NaOH solution. Meanwhile, an AlN film formed at the point where the total power reached 100 kWh was confirmed to be an AlN film having relatively many pits in the etching with the NaOH solution. Furthermore, AlN films were formed multiple times without performing the impedance adjustment using the matching box, and it was confirmed that the formed AlN films were AlN films having more pits in the etching with the NaOH solution.

From the above, it is found that the reproducibility of +c polarity decreases when the group III nitride semiconductor thin film is formed on the α-$Al_2O_3$(0001) substrate without adjusting the impedance of the second substrate supporting device.

As described above, a major characteristic of the present invention is the point of focusing on adjusting the impedance of the second substrate supporting device provided in the outer peripheral portion of the substrate to achieve excellent reproducibility of +c polarity of the group III nitride semiconductor, and is a technical idea which does not conventionally exist.

In the present invention, based on the unique technical idea of the present invention described above, the substrate holder is provided with the substrate holding device (substrate supporting portion) for disposing the substrate at the predetermined distance away from the substrate facing surface of the heater, and the substrate is located away from the substrate facing surface of the heater in the formation of the group III nitride semiconductor thin film. Moreover, the impedance of the second substrate supporting device provided in the substrate outer peripheral portion is adjusted. As a result, it is possible to maintain excellent reproducibility of +c polarity of the group III nitride semiconductor thin film as described in the aforementioned first example and the first comparative example.

Note that, although description is given of the case where only the substrate is introduced into the vacuum chamber in the embodiment and the examples described above, the substrate may be introduced by using a tray. Based on the idea of the present invention, it is only necessary to dispose the substrate and the tray on which the substrate is placed at the predetermined distance away from the heater when the tray on which the substrate is placed is disposed on the substrate holding device. Moreover, the substrate may be introduced by using the substrate supporting portion 704a as the tray.

Furthermore, the present inventors have found that applying the technical idea described above to the case where a substrate material such as a Si (111) substrate is used and the case where a thin-film material such as a zinc-oxide (ZnO) based semiconductor thin film is formed is effective in obtaining a high-quality epitaxial film with excellent reproducibility. Description is given below of an example in which the group III nitride semiconductor thin film having the wurtzite structure is formed on a Si (111) substrate by using the film formation method in one embodiment of the present invention (second example), an example in which the group III nitride semiconductor thin film is formed on the Si (111) substrate without using the film formation method in one embodiment of the present invention (second comparative example), an example in which a ZnO-based semiconductor thin film having the wurtzite structure is formed on the α-$Al_2O_3$(0001) substrate by using the film formation method in one embodiment of the present invention (third example), and an example in which the Zno-based semiconductor thin film is formed on the α-$Al_2O_3$(0001) substrate without using the film formation method in one embodiment of the present invention (third comparative example).

Second Example

In this example, a Si (111) substrate in which a natural oxidation film on a surface was removed by hydrofluoric acid treatment was used, and the AlN film having the wurtzite structure was formed in the same method and conditions as those in the first example. However, the film formation temperature (550° C.) in the example was set based on results of substrate temperature measurement performed in advance by using the Si (111) substrate in which a thermocouple was embedded.

In the AlN film formed on the Si (111) substrate in the example, excellent reproducibility of +c polarity among the treated substrates could be maintained by adjusting the impedance of the second substrate supporting device.

Second Comparative Example

In this comparative example, the AlN film was formed on the Si (111) substrate by using the same method and conditions as those of the second example, without adjusting the impedance of the second substrate supporting device. As a result, it was found that the reproducibility of +c polarity among the treated substrates decreased.

Third Example

In this example, a ZnO film having the wurtzite structure was formed on the α-$Al_2O_3$(0001) substrate in the same method and conditions as those in the first example, except for the target material, the process gas, the film formation temperature, and the film thickness. The target material was metal Zn, the process gas was a mixed gas of and Ar ($O_2/(O_2+Ar)$ was 25%), the film formation temperature was 800° C., and the film thickness was 100 nm.

The ZnO film in the example was formed as an epitaxial film having the same crystal structure (wurtzite structure) as the group III nitride semiconductor and having the c-axis orientation like the group III nitride semiconductor, and the polarity of the ZnO film was +c polarity (Zn polarity).

Moreover, excellent reproducibility of +c polarity among the treated substrates can be maintained by adjusting the impedance of the second substrate supporting device.

Meanwhile, when a target made of Mg—Zn alloy is used instead of the metal Zn target and a Mg-added ZnO film (hereafter, MgZnO film) having the wurtzite structure is formed by the film formation method in one embodiment of the present invention, the MgZnO film with +c polarity and excellent crystallinity like the ZnO film is obtained. Moreover, excellent reproducibility of +c polarity among the treated substrates could be maintained by adjusting the impedance of the second substrate supporting device.

Third Comparative Example

In this comparative example, the ZnO film was formed on the $\alpha$-$Al_2O_3$(0001) substrate by using the same method and conditions as those of the third example, without adjusting the impedance of the second substrate supporting device. It was found that the ZnO film in the comparative example was obtained as an epitaxial film having the c-axis orientation like that in the third example, but the reproducibility of +c polarity among the treated substrates decreased.

Note that, when the same experiment as that in the third example is performed by using the Si (111) substrate, the ZnO-based semiconductor thin film with +c polarity can be obtained on the Si (111) substrate with excellent reproducibility. Meanwhile, it is found that, when the same experiment as that in the third comparative example is performed by using the Si (111) substrate, the reproducibility of +c polarity among the treated substrates decreases in the obtained ZnO-based semiconductor thin film.

Fourth Example

Figure 14B:
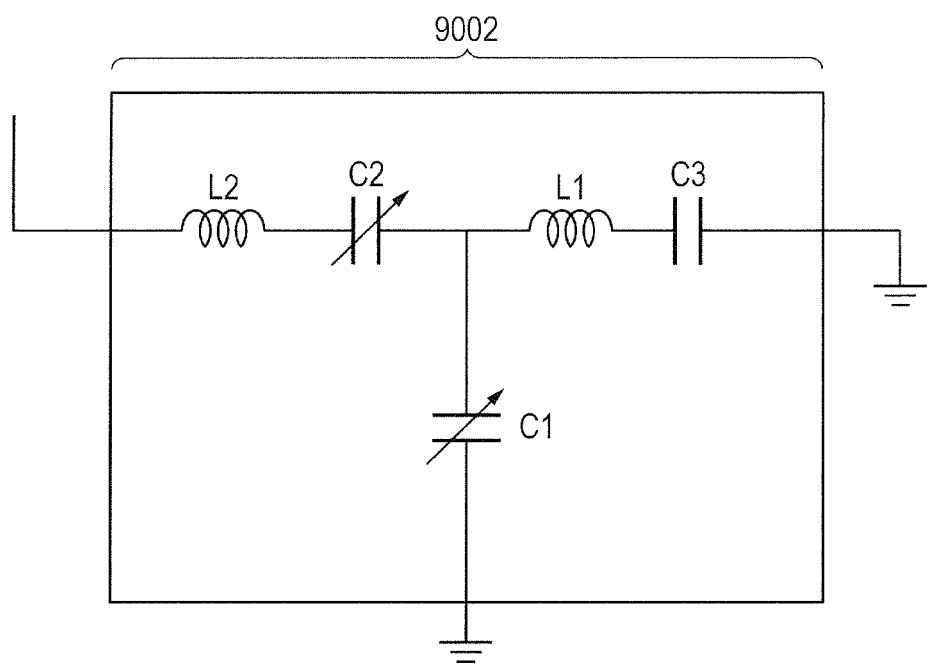
FIG. 14B is a configuration example of a circuit diagram of an impedance varying mechanism in one embodiment of the present invention.

In this example, description was given of an example in which the AlN film was formed on the $\alpha$-$Al_2O_3$(0001) substrate by using the configuration example of the holder supporting portion illustrated in FIG. 7. A circuit diagram of the impedance varying mechanism 9002 in FIG. 7 has a structure illustrate in FIG. 14B. In the example, there was used the impedance varying mechanism 9002 including, as illustrated in FIG. 14B, a capacitor C1 variable from 219 to 1370 pF, a capacitor C2 variable from 80.5 to 480 pF, a fixed capacitor C3 of 4.7 pF, a coil L2 of 0.886 µH, and a coil L1 of 0.35 µH. First, C1 was set to 1370 pF and C2 was set to 144.42 pf and the AlN film was formed under the same conditions as those in the first example. The adjustment value of each of the variable capacitors was a value predetermined based on the measurement results of the sensor 9001. The relationship between the voltage induced in the target electrode and the voltage induced in the second substrate supporting device which were measured by the sensor 9001 in this case was the same as those in FIG. 11.

As apparent from FIG. 11, the radio-frequency voltage induced in the target electrode and the radio-frequency voltage induced in the second substrate supporting device had a substantially-opposite phase relationship. Moreover, the DC voltage induced in the target electrode was about −20 V and the DC voltage induced in the second substrate supporting device was about −150 V. The AlN film obtained in such a state was measured by CAICISS and it was found that the AlN film had substantially+c polarity. Moreover, the obtained AlN film was etched with the NaOH solution, and almost no pits were formed. Accordingly, it was considered that almost no+c polarity portions were formed in the obtained AlN film.

Next, the sputtering process was continuously performed by using a dummy substrate under the same conditions as those described above and the AlN film was formed again on the $\alpha$-$Al_2O_3$(0001) substrate at a point where the total power reached 100 kWh. A relationship between the voltage induced in the target electrode and the voltage induced in the second substrate supporting device measured by the sensor 9001 in this case was the same as that in FIG. 12.

As apparent from FIG. 12, the radio-frequency voltage induced in the target electrode and the radio-frequency voltage induced in the second substrate supporting device had substantially the same phase relationship. Moreover, the DC voltage induced in the target electrode was about −90 V and the DC voltage induced in the second substrate supporting device was about +20 V. The AlN film obtained in such a state was measured by CAICISS and it was found that the AlN film had substantially+c polarity. Moreover, the AlN film was etched with the NaOH solution, and relatively many pits were confirmed. Accordingly, it was considered that, although the obtained AlN film had+c polarity as a whole,+c polarity portions locally existed. This is considered due to variation in the impedance of the second substrate supporting device over time which is caused by deposition of the AlN film on the second substrate supporting device.

Thereafter, the relationship between the voltage induced in the target electrode and the voltage induced in the second substrate supporting device was checked with the sensor 9001 while varying the C1 and the C2. A state substantially the same as that in FIG. 11 was obtained by setting the C1 to 1370 pF and the C2 to 142.42 pF. An AlN film was formed in this state. An AlN film was formed in this state and it was found that the formed AlN film was an AlN film which was determined to have substantially+c polarity in the CAICISS measurement and in which almost no pits were confirmed in the etching with the NaOH solution, that is, an AlN film in which almost no+c polarity portions existed. In other words, an AlN film similar to the AlN film obtained in the state of FIG. 11 can be obtained by adjusting the C1 and the C2 of the impedance varying mechanism. Accordingly, it is possible to increase the reproducibility of the polarity of the AlN film.

Note that, although description is given of the case where the relationship between the voltage induced in the target electrode and the voltage induced in the second substrate supporting device changes from the opposite phase to the same phase by repeating of the film formation in the example, the relationship is not limited to this. For example, when the C1 is set to 995.93 pF and the C2 is set to 140.43 pF, performing the formation of the AlN film repeatedly causes the voltage induced in the target electrode and the voltage induced in the second substrate supporting device to sometimes change from the state similar to that in FIG. 11 to the state similar to that in FIG. 13. In FIG. 13, a radio-frequency voltage with substantially twice the frequency of the radio-frequency voltage induced in the target electrode is induced in the second substrate supporting device. Also in this case, it is possible to return to the state of FIG. 11 by using a method similar to that described above. In other words, it is possible to increase the reproducibility of the polarity of the AlN film.

Fifth Example

In this example, semiconductor light emitting elements and semiconductor electronic elements were fabricated by using the AlN film obtained in the examples described above. As a result, stable quality could be achieved in the semiconductor light emitting elements and semiconductor electronic elements manufactured by the film formation method of the present invention. Moreover, stable quality could be obtained also when an illuminating apparatuses were fabricated by using the manufactured semiconductor light emitting elements.

Note that substrates usable in the film formation method of the present invention are not limited to the $\alpha$-Al$_2$O$_3$(0001) substrate and the Si (111) substrate.

For example, although the $\alpha$-Al$_2$O$_3$(0001) substrate and the Si (111) substrate have epitaxial relationships with the group III nitride semiconductor thin film and the ZnO-based semiconductor thin film, these substrates do not have, on the surfaces thereof, crystal information capable of controlling the polarities of the group III nitride semiconductor thin film, the ZnO-based semiconductor thin film, and the like. Such substrates are described as substrates with non-polar surfaces in this description.

Accordingly, it is difficult to form the group III nitride semiconductor thin film and the ZnO-based semiconductor thin film with +c polarity on the substrates having the non-polar surfaces, without using a film formation method capable of controlling the polarities of the group III nitride semiconductor thin film and the ZnO-based semiconductor thin film having the wurtzite structure, like the film formation method of the present invention. However, by using the film formation method of the present invention, the group III nitride semiconductor thin film and the ZnO-based semiconductor thin film having+c polarity and the wurtzite structure can be formed also on the substrates having the non-polar surfaces.

Substrates having such non-polar surfaces include a germanium (Ge) (111) substrate, a Si (111) substrate having a surface on which a SiGe epitaxial film with (111) orientation is formed, a Si (111) substrate on which a carbon (C) doped Si (111) epitaxial film with (111) orientation is formed, and the like.

Moreover, a 4H-SiC (0001) substrate and a 6H-SiC (0001) substrate having substrate surfaces called Si planes, a GaN (0001) substrate having a substrate surface called Ga plane, and the like are generally used to obtain the group III nitride semiconductor thin film and the ZnO-based semiconductor thin film with +c polarity. The substrates having the planes described above have epitaxial relationships with the group III nitride semiconductor thin film and the ZnO-based semiconductor thin film to be formed on the substrates and also have, on the substrate surfaces, crystal information capable of controlling the group III nitride semiconductor thin film and the ZnO-based semiconductor thin film such that the films have+c polarity. Accordingly, these substrates have such characteristics that the group III nitride semiconductor thin film and the ZnO-based semiconductor thin film with +c polarity can be easily obtained without using a special film formation technique capable of controlling the polarities of the group III nitride semiconductor thin film and the ZnO-based semiconductor thin film. Note that substrates having epitaxial relationships with the group III nitride semiconductor thin film and the ZnO-based semiconductor thin film and also having crystal information capable of controlling the group III nitride semiconductor thin film and the ZnO-based semiconductor thin film such that the films have+c polarity as described above are referred to as substrates having polar surfaces.

In these substrates having the polar surfaces, the group III nitride semiconductor thin film and the ZnO-based semiconductor thin film in which the proportion of +c polarity is high and which thus has relatively high quality can be obtained even when no film formation method in one embodiment of the present invention is used. However, also in the case of using such substrates, the group III nitride semiconductor thin film and the ZnO-based semiconductor thin film having the wurtzite structure can be obtained with even higher quality by using the film formation method in one embodiment of the present invention.

When the substrates having the polar surfaces described above are used, the group III nitride semiconductor thin film, the ZnO-based semiconductor thin film, and the like are likely to be obtained as substantially-uniform epitaxial films with +c polarity. However, there is a case where few+c polarity regions (hereafter described as inverted domain regions) are partially formed, particularly in an initial stage of the growth. This sometimes leads to formation of defects such as an anti-phase domain boundary which are propagated to the surface of the thin film. Specifically, since using the film formation method in one embodiment of the present invention further reduces the possibility of formation of such inverted domain regions and further suppresses the formation of defects such as the anti-phase domain boundary, it is considered that the effects of the present invention can be obtained also when the substrates having the polar surfaces are used.

A term "epitaxial grown substrate" is used as a collective term for such substrates having epitaxial relationships with the group III nitride semiconductor thin film and the ZnO-based semiconductor thin film and having non-polar surfaces or polar surfaces.

A major characteristic of the present invention is the point of focusing on adjusting the impedance of the second substrate supporting device provided in the outer peripheral portion of the substrate to achieve excellent reproducibility of +c polarity of the group III nitride semiconductor thin film and the ZnO-based semiconductor thin film having the wurtzite crystal structure and formed on the epitaxial growth substrate, and is a technical idea which does not conventionally exist.

The invention claimed is:

1. A sputtering method of forming an epitaxial film of a+c polarity with a wurtzite structure on a substrate using a vacuum processing apparatus which includes:
   a vacuum chamber capable of being vacuumed;
   a heater which has therein a heater electrode capable of heating the substrate to a given temperature;
   a target electrode which is provided in the vacuum chamber and to which a target is attachable;
   a first radio-frequency power supply which inputs first radio-frequency power into the target via the target electrode;
   a substrate holding device which is disposed around the substrate, which forms part of a return route through which the radio-frequency power input from the first radio-frequency power supply returns to a ground, and which is capable of supporting the substrate;
   a holder supporting unit provided in the vacuum chamber, for supporting the substrate holding device to separate, by a predetermined distance, a back surface of the substrate holding device from a substrate facing surface of the heater;
   an impedance adjuster, which is disposed between the holder supporting unit and the ground, which adjusts impedance of the substrate holding device, and which forms part of the return route;
   a second radio-frequency power supply, placed between the ground and the impedance adjuster, for inputting second radio-frequency power into the substrate holding device via the holder supporting unit; and
a sensor, which forms part of the return route, having one end connected to the target electrode and the other end connected to the holder supporting unit for measuring a voltage between the target electrode and the substrate holding device,
the sputtering method comprising:
   a substrate transporting step of holding, on the substrate holding device, the substrate so as to be held at a predetermined distance away from the substrate facing surface of the heater;
   a film forming step of forming, by sputtering from the target electrode, an aluminum nitride epitaxial film of +c polarity with the wurtzite structure on the substrate held on the substrate holding device; and
   an impedance adjustment step of adjusting the impedance adjuster such that the impedance of the substrate holding device is set to a predetermined value in the film forming step,
   wherein the impedance adjustment step measures, using the sensor, a first voltage (VTGT) of a first radio-frequency voltage induced in the target electrode and having a first peak-to-peak amplitude and a second voltage (VHOD) of a second radio-frequency voltage induced in the substrate holding device and having a second peak-to-peak amplitude smaller than the first peak-to-peak amplitude, and adjusts capacitances of variable capacitors included in the impedance adjuster so that the first and second voltages (VTGT, VHOD) have an opposite phase relationship and restore the first and second peak-to-peak amplitudes.

2. The sputtering method according to claim 1, further comprising a substrate heating step of heating the substrate to the given temperature by using the heater,
   wherein the film forming step is a step of forming the epitaxial film of +c polarity with the wurtzite structure on the substrate heated during the substrate heating step.

3. The sputtering method according to claim 2, wherein the substrate holding device holds the substrate while being in contact with a lower surface of the substrate in a direction of gravity.

4. A method of manufacturing a semiconductor light emitting element comprising the sputtering method according to claim 1.

5. A method of manufacturing a semiconductor electronic element comprising the sputtering method according to claim 1.

6. The sputtering method according to claim 1, wherein a part of the holder supporting unit is formed from an electrically-conductive material, and the sensor is disposed between the target electrode and the electrically-conductive material.

* * * * *